(12) United States Patent
Kitano et al.

(10) Patent No.: US 6,383,948 B1
(45) Date of Patent: May 7, 2002

(54) COATING FILM FORMING APPARATUS AND COATING FILM FORMING METHOD

(75) Inventors: Takahiro Kitano; Masateru Morikawa; Yukihiko Esaki; Nobukazu Ishizaka; Norihisa Koga; Kazuhiro Takeshita; Hirofumi Ookuma; Masami Akimoto, all of Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/734,922

(22) Filed: Dec. 13, 2000

(30) Foreign Application Priority Data

Dec. 20, 1999 (JP) .......................... 11-361266
Dec. 20, 1999 (JP) .......................... 11-361267

(51) Int. Cl.$^7$ ..................... H01L 21/31; H01L 21/469; B05C 13/02; B05B 5/025
(52) U.S. Cl. ..................... 438/758; 118/52; 118/631
(58) Field of Search ..................... 118/52, 630, 631; 427/240; 438/758

(56) References Cited

U.S. PATENT DOCUMENTS 6,004,047 A * 12/1999 Akimoto et al. ............ 396/604
6,063,439 A * 5/2000 Semba et al. ............... 427/240
6,117,486 A * 9/2000 Yoshihara ................... 427/240
6,190,063 B1 * 2/2001 Akimoto ..................... 396/611

FOREIGN PATENT DOCUMENTS

JP      2000-077326      3/2000

* cited by examiner

Primary Examiner—Alexander G. Gmyka
(74) Attorney, Agent, or Firm—Rader, Fishman & Grauer, PLLC

(57) ABSTRACT

A coating area of wafer W is divided into, for example, three regions. The wafer W and/or a supply nozzle are driven in a predetermined coating direction and/or a coating direction such that coating start positions of the adjacent divided regions are not next to each other and/or the coating is not continuously performed in order of a coating end position and a coating start position when the coating end position of one region of the adjacent divided regions and the coating start position of the other region are adjacent to each other, whereby forming a liquid film of a resist liquid for each divided region of the surface of wafer W. As a result, a phenomenon, in which the resist liquid is drawn to the coating start position, so as to increase the film thickness of this portion, occurs in only the corresponding region. Resultantly, uniformity of an inner surface of the film thickness can be improved.

19 Claims, 31 Drawing Sheets

DATA IN FIST MEMORY

| SOLID CONTENT | DISCHARGE-FLOW RATE | | | | |
|---|---|---|---|---|---|
| A1% | DISCHARGE PRESSURE | P11 | P12 | P13 | ······ | P1n |
| | FLOW RATE | L11 | L12 | L13 | ······ | L1n |
| A2% | DISCHARGE PRESSURE | P21 | P22 | P23 | ······ | P2n |
| | FLOW RATE | L21 | L22 | L23 | ······ | L2n |
| | | | | | | |
| A3% | DISCHARGE PRESSURE | Pm1 | Pm2 | Pm3 | ······ | P2mn |
| | FLOW RATE | Lm1 | Lm2 | Lm3 | ······ | L2mn |

FIG.24

| TARGET FILM THICKNESS 0.5 μm | SOLID CONTENT QUANTITY 5.0% |
|---|---|
| DISCHARGE PRESSURE | 2.0kg/cm² |
| SCANNING SPEED | 1m/s |
| PITCH | |

FIG.25A

| TARGET FILM THICKNESS 0.5 μm | SOLID CONTENT QUANTITY 5.0% |
|---|---|
| DISCHARGE PRESSURE | 2.0kg/cm² |
| SCANNING SPEED | 1m/s |
| PITCH | 0.36mm |

FIG.25B

| TARGET FILM THICKNESS 0.5μm | SOLID CONTENT QUANTITY 5.0% |
|---|---|
| MEASURED FILM THICKNESS △△μm | |

SELECTION OF CORRECTED PARAMETER

DISCHARGE PRESSURE | SCANNING SPEED | PITCH

CORRECTED PARAMETER

| | |
|---|---|
| DISCHARGE PRESSURE | 2.0kg/cm² |
| SCANNING SPEED | 1m/s |
| PITCH | ○○mm |

FIG.26

RECIPE DATA IN SECOND MEMORY

| RECIPE | FILM THICKNESS (μm) | SOLID CONTENT QUANTITY (%) | DISCHARGE PRESSURE (kg/cm²) | FLOW RATE (cc/min) | SCANNING SPEED (m/sec) | PITCH (mm) |
|---|---|---|---|---|---|---|
| 1 | d1 | A1 | P1 | L1 | V1 | Y1 |
| 2 | d2 | A2 | P2 | L2 | V2 | Y2 |
| 3 | d3 | A3 | P3 | L3 | V3 | Y3 |
| ⋮ | ⋮ | ⋮ | ⋮ | ⋮ | ⋮ | ⋮ |

FIG.27

CORRECTED RECIPE DATA IN FOURTH MEMORY

| RECIPE | FILM THICKNESS (μm) | SOLID CONTENT QUANTITY (%) | DISCHARGE PRESSURE (kg/cm²) | FLOW RATE (cc/min) | SCANNING SPEED (m/sec) | PITCH (mm) |
|---|---|---|---|---|---|---|
| 1 | d1 | A1′ | P1 | L1′ | V1 | Y1′ |
| 2 | d2 | A2 | P2 | L2 | V2 | Y2 |
| 3 | d3 | A3 | P3 | L3 | V3 | Y3 |
| ⋮ | ⋮ | ⋮ | ⋮ | ⋮ | ⋮ | ⋮ |

PRIOR ART

COATING FILM FORMING APPARATUS AND COATING FILM FORMING METHOD

BACKGROUND OF THE INVENTION

1. Field of the Invention

The present invention relates to a coating film forming apparatus and a coating film forming method for coating, for example, a semiconductor wafer, and a processing substrate such as an LCD substrate, an exposure mask and the like with liquid, which is obtained by dissolving resin and so on, particularly a resist liquid to form a film of this liquid.

2. Description of the Related Art

A mask for forming a circuit pattern on a surface of a semiconductor wafer, and that of a processing substrate such as an LCD substrate and like is obtained by coating the substrate surface with a resist liquid, irradiating the resist surface with light, an electron beam, or an ion beam and developing the resultant. As a resist liquid coating method, a spin coating method is mainly used. This method, for example, as shown in FIG. 33, a substrate, e.g., a semiconductor wafer (hereinafter referred as "wafer") W is absorbed and held on a spin chuck 11 having a vacuum absorbing function, a resist liquid 13 is dropped on the central portion of wafer W from a nozzle 12, thereafter, the wafer W is rotated at high speed, whereby diffusing the resist liquid 13 to the entirety of wafer W by a rotational centrifugal force, so that a substantially uniform resist film is formed over the entire surface of wafer W.

There has been a growing trend in recent years to fine the wiring width of the circuit pattern, and it is required that a resist film be thinned since the wiring width of the circuit is proportional to the thickness of the resist film and an exposure wavelength. In the spin coating method, an increase in the rotational speed of wafer W allows the resist film to be thinned. For this reason, for example, 8-inch wafer W is rotated at high speed of 200 to 4000 rpm.

However, this spin coating method has the following problems to be solved.

First, according to this method, when the wafer W is upsized, peripheral speed at an outer peripheral portion is increased, so that air turbulence is generated. The thickness of resist film is easily varied by this air turbulence to reduce uniformity of the resist film thickness, and this causes a reduction in exposure resolution. For this reason, it is difficult to obtain a fixed coating thickness in the case of the film thickness of 0.4 $\mu$m or less, and there is a limitation in the manufacture of about more than some giga-semiconductors naturally.

Next, according to this method, in the process in which the resist liquid is spread to the peripheral edge portion from the central portion of wafer W, solvents contained in the resist liquid are sequentially evaporated. This makes a difference in viscosity of the resist liquid along the diffusion direction, to cause a possibility that the thickness of resist film formed between the central portion and the peripheral edge portion will differ.

Moreover, according to this method, since the wafer W is rotated at high speed, the amount of resist liquid, which is spread from the peripheral edge portion of wafer W and becomes useless, is large. As one example, it is clear that only 10% or less of the amount of resist liquid supplied onto the wafer W contributes to formation of resist liquid film.

Furthermore, though there is a necessity to rotate the wafer W in a cup to receive the splashing resist liquid, there is a possibility that the resist liquid adhered onto the cup will form particles with which the wafer W will be polluted. For this reason, the cup must be frequently cleaned.

Still furthermore, according to this method, the outside area of the circuit forming area of wafer W is also coated with the resist liquid. If the resist liquid is left in this area, this will cause occurrence of particles in the later process. For this reason, the resist liquid of this area must be removed by a dedicated device, which is called edge remover, just after the resist liquid coating process.

As a method in place of the aforementioned spin coating method, the inventors of this invention have reviewed the following method (hereinafter referred to as "one-stroke drawing type"):

Specifically, as shown by a solid line in FIG. 34, the nozzle 12 for discharging the resist liquid 13 onto the surface of wafer W and the wafer W are relatively reciprocated in an X direction as being intermittently feeding by a predetermined pitch in a Y direction to coat the wafer W with the resist liquid in the so-called one-stroke drawing manner. In this case, it is preferable that the portion other than the circuit forming area of wafer W be covered with a mask in order to prevent the resist liquid from being adhered onto the peripheral edge of wafer W and the rear surface. In this method, since the wafer W is not rotated, the aforementioned problems are solved and the resist-liquid coating can be performed without wasting the resist liquid.

In the coating method of the one-stroke drawing type, a diameter of a discharge hole of the nozzle 12 is formed considerably thinly, that is, about 10 $\mu$m to 200 $\mu$m in order to reduce the thickness of the resist film. When the resist liquid 13 is discharged from the nozzle 12 and collides with the wafer 12, the resist liquid 13 expands wider than the discharge diameter as shown in, for example, FIG. 35, with the result that the discharged resist liquids 13 are connected to one another and a liquid film of the resist liquid 13 is formed on the entirety of the surface of the wafer W.

However, when the coating of the resist liquid 13 is made from a coating start point, which is shown by Ya in FIG. 36, to a coating end point, which is shown by Yb, in a direction shown by an arrow in the figure, there is confirmed occurrence of a phenomenon in which the film thickness at point Ya becomes larger than the film thickness at point Yb. Depending on the kind of resist liquid 13, the film thickness at point Ya becomes conspicuously high in some cases.

The reason can be considered as follows:

Specifically, the resist liquid 13 is drawn to the pre-coated area shown by slanted lines of FIG. 20 by the above-mentioned expansion of the resist liquid 13, which is caused by the collision with the wafer W. In this way, the film thickness at point Ya becomes large.

While, in order to obtain a necessary film thickness, parameters such as a discharge quantity of resist liquid, discharge pressure, scanning speed of coating liquid nozzle (moving rate in an X direction), an index pitch (intermittent moving distance) of wafer W, and so on are appropriately set, coating of resist liquid is performed on the condition, and drying is performed, and then the thickness of the resist film is measured. Then, the discharge pressure is controlled based on the measurement result. However, the work for controlling the parameters by trial and error is cumbersome. In addition, when the solid content quantity in the resist liquid varies, the amount of solvent, which is volatilized and disappears, varies even if the coating with the same amount is carried out, with the result that the film thickness of the resist is changed. Moreover, the range for changing the values of the respective parameters is determined to some degree in accordance with hardware configuration. For this reason, regarding a case in which the film thickness is doubled, it is impossible to deal with such a case by a method in a value of one parameter is simply doubled. Namely, the plurality of parameters must be controlled. For the above-mentioned reason, a so-called condition derivation work is complicated and needs much time, causing a problem in which smooth activation of the apparatus is prevented.

SUMMARY OF THE INVENTION

It is an object of the present invention is to provide a coating film forming apparatus, which is capable of obtaining a stable film thickness over a substrate surface by dividing a coating area of the substrate, and relates to a coating film forming method.

Another object of the present invention is to provide a coating film forming apparatus, which is capable of forming a coating film with a high yield of coating liquid and uniformity, and which is capable of easily performing a parameter value setting work for obtaining a necessary film thickness, and to provide a coating film forming method.

In order to attain the above objects, according to the present invention, there is provided a substrate holding section for holding a substrate substantially horizontally; a supply nozzle for supplying treatment solution to a surface of the substrate held by the substrate holding section; a driving mechanism for relatively driving the substrate holding section and the supply nozzle along a substrate surface direction; and a control section for controlling an operation of the driving mechanism, wherein the control section controls the operation of the substrate holding section and/or the supply nozzle through the driving mechanism to supply the treatment solution to each of divided coating regions of the substrate in a predetermined coating order and/or a predetermined coating direction, and controls timing at which the treatment solution is supplied to the substrate from the supply nozzle, whereby forming a liquid film of the treatment solution for each divided region of the substrate surface.

Moreover, according to the present invention, there is provided a coating film forming apparatus comprising the steps of supplying a treatment solution to a first region on a substrate, which is divided into at least first and second regions, as relatively moving the substrate and a supply nozzle for supplying the treatment solution onto the substrate along a substrate surface direction; and supplying the treatment solution to the second region as relatively moving the substrate such that a coating start position is nonadjacent to a coating end position in the supply step of the first region.

According to the above structure, the phenomenon, in which the resist liquid is drawn to the coating start position, so as to increase the film thickness of the portion, occurs in only the corresponding region. The amount of treatment solution, which is drawn to the coating start position, is small in the corresponding region. Though the film thickness at the coating start position is large, the degree thereof is considerably relaxed as compared with the case in which the coating area of the substrate is not divided. Resultantly, uniformity of the inner surface of the film thickness can be improved.

Regarding the control section, if the coating start points of the adjacent divided regions are next to each other, the amount of treatment solution, which is drawn to the boundary portion, is increased, so that and the film thickness of the corresponding portion is conspicuously increased. For this reason, it is desirable that the coating start points of the adjacent divided regions should not be next to each other. Moreover, if the coating is continuously performed in order of the coating end position and the coating start position when the coating end position of one region of adjacent divided regions and the coating start position of the other region are next to each other, these two regions are coated together. As a result, the treatment solution is drawn to the coating start position of the fist coating region, and the film thickness of this portion is increased. In this case, it is desirable that the coating should not be continuously performed in order of the coating end position and the coating start position.

The driving mechanism may have the structure in which the driving mechanism relatively moves the supply nozzle and the substrate holding section in a direction substantially orthogonal to one side of a circuit forming area of the substrate as being intermittently fed at a predetermined pitch in a direction substantially parallel to the one side of the circuit forming area.

In this case, the driving mechanism may be structured such that the supply nozzle and the substrate holding section are relatively rotated about a vertical axis and the control section may be structured to perform such control through the driving mechanism that the supply nozzle and the substrate holding section are relatively rotated about a vertical axis before moving the supply nozzle and the substrate holding section, which are placed at a coating end position of the divided region, to a coating start position of the divided region to be next coated. In this case, the coating direction and the moving direction of the supply nozzle can be aligned, whereby allowing the coating to be performed in the set coating order and coating direction.

Moreover, the driving mechanism may have the structure in which the driving mechanism relatively moves the supply nozzle and the substrate holding section as if a spiral were drawn on the surface of the substrate held by the substrate holding section. As an example of the treatment solution, the resist liquid can be named.

Furthermore, according to the present invention, there is provided a coating film forming apparatus comprising a substrate holding section for holding a substrate; a supply nozzle, which is disposed to be opposite to the substrate held by the substrate holding section, for discharging treatment solution to the corresponding substrate; a treatment solution supply control section for controlling discharge of the treatment solution from the supply nozzle; an X-direction driving mechanism for moving the supply nozzle in an X direction; a Y-direction driving mechanism for relatively moving the substrate holding section and the supply nozzle intermittently in a Y direction; a parameter setting section for partially designating parameters values, which are processing conditions for applying the coating of treatment solution to the substrate by the supply nozzle, to set a residual parameter value; and processing means for generating a control signal for controlling the supply control section, X-direction driving mechanism, and Y-direction driving condition based on the parameter value set by the parameter setting section, wherein the corresponding supply nozzle is moved in the X direction as discharging the treatment solution from the supply nozzle in a state that the substrate holding section is stopped, and then the substrate holding section and the supply nozzle are relatively moved in the Y direction, and this operation is repeated, whereby applying the treatment solution to an entire surface of a coating film forming area of the substrate.

Still furthermore, according to the present invention, there is provided a coating film forming method comprising the step of partially designating parameters values, which are processing conditions at the time of supplying a treatment solution to a substrate, to set a residual parameter value; and supplying the treatment solution onto the substrate based on the set parameter values as relatively moving a supply nozzle for supplying the treatment solution onto the substrate and the held substrate.

In this invention, the treatment solution is applied to the substrate as discharging the treatment solution in the form of a line with a thin diameter. The partial parameter values are any two of a scanning speed, which is a moving speed of the supply nozzle in the X direction, a pitch, which is a relative intermittent moving distance of the substrate in the Y direction with respect to the supply nozzle, and either one of discharge pressure and a discharge flow rate of the treatment solution of the supply nozzle, and the residual parameter value is one of these residual parameter values.

The parameter setting section comprises a first storage section, which stores the relationship between the discharge pressure and the discharge flow rate of the treatment solution in accordance with a diameter hole of the supply nozzle and a solid content quantity of the treatment solution, and a target film thickness of the coating film and a solid content quantity of the treatment solution are designated, and there is provided a function of designating two of the scanning speed, pitch, and discharge pressure, whereby obtaining one residual value among the scanning speed, pitch, discharge pressure based on these designated values and data stored in the storage section. Also, the parameter setting section comprises a display section for displaying the designated parameter values and the obtained parameter value.

According to the aforementioned invention, it is possible to obtain the coating film with high uniformity of the inner surface of the film thickness as compared with the spin coating method. Moreover, there is substantially no waste of coating liquid, and the yield of coating liquid is improved. Then, even if all parameters are not set, the combinations of parameters corresponding to the target film thickness can be automatically attained, by setting only a part of parameters, so that the condition derivation of film thickness is easily carried out.

In the above invention, it is preferable that the parameter setting section should correct the parameter value based on the measured film thickness, which is actually obtained by the set parameter values, and the target film thickness. In this case, the condition derivation of film thickness is more easily carried out.

Furthermore, according to another invention, there is provided a coating film forming apparatus comprising a substrate holding section for holding a substrate; a supply nozzle, which is disposed to be opposite to the substrate held by the substrate holding section, for discharging treatment solution to the corresponding substrate; a treatment solution supply control section for controlling discharge of the treatment solution from the supply nozzle; an X-direction driving mechanism for moving the supply nozzle in an X direction; a Y-direction driving mechanism for relatively moving the substrate holding section and the supply nozzle intermittently in a Y direction; a parameter setting section for setting parameter values, which are processing conditions for applying the coating of treatment solution to the substrate by the supply nozzle, to correct the parameter values based on a measured film thickness, which is actually obtained by the set parameter values, and a target film thickness; and processing means for generating a control signal for controlling the supply control section, X-direction driving mechanism, and Y-direction driving condition based on the parameter value set by the parameter setting section, wherein the corresponding supply nozzle is moved in the X direction as discharging the treatment solution from the supply nozzle in a state that the substrate holding section is stopped, and then the substrate holding section and the supply nozzle are relatively moved in the Y direction, and this operation is repeated, whereby applying the treatment solution to an entire surface of a coating film forming area of the substrate.

These objects, other objects and advantages of the present invention will become readily apparent by the following description and the accompanying drawings.

BRIEF DESCRIPTION OF THE DRAWINGS

FIG. 24 is an explanatory view showing data stored in a first memory;

FIG. 25 is an explanatory view showing a display content of a screen of a display section;

FIG. 26 is an explanatory view showing a display content of a screen of a display section;

FIG. 27 is an explanatory view showing data stored in the first memory;

DETAILED DESCRIPTION OF THE PREFERRED EMBODIMENT

A preferred embodiment of the present invention will be specifically described with reference to the accompanying drawings.

Figure 1:
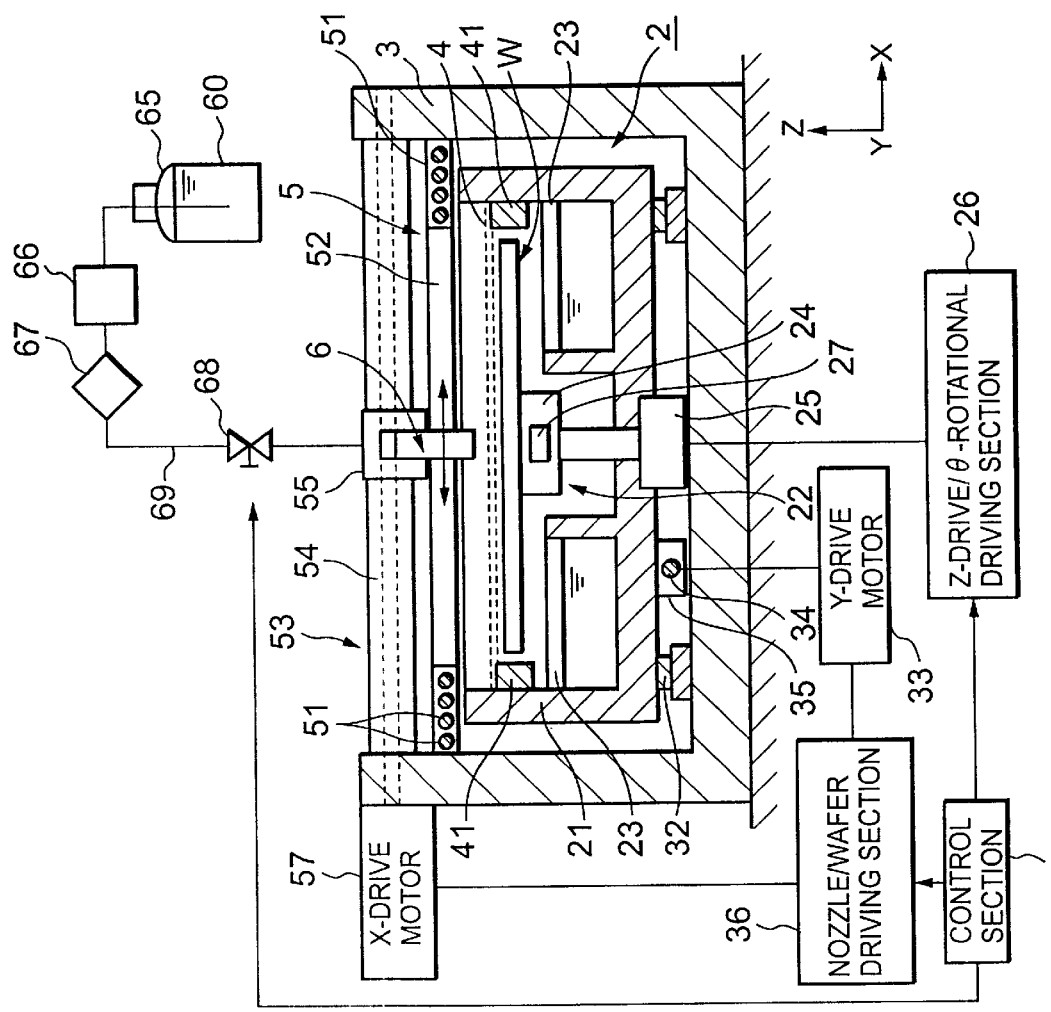
FIG. 1 is a cross-sectional view showing one example of an embodiment of the coating film forming apparatus of the present invention.
Figure 2:
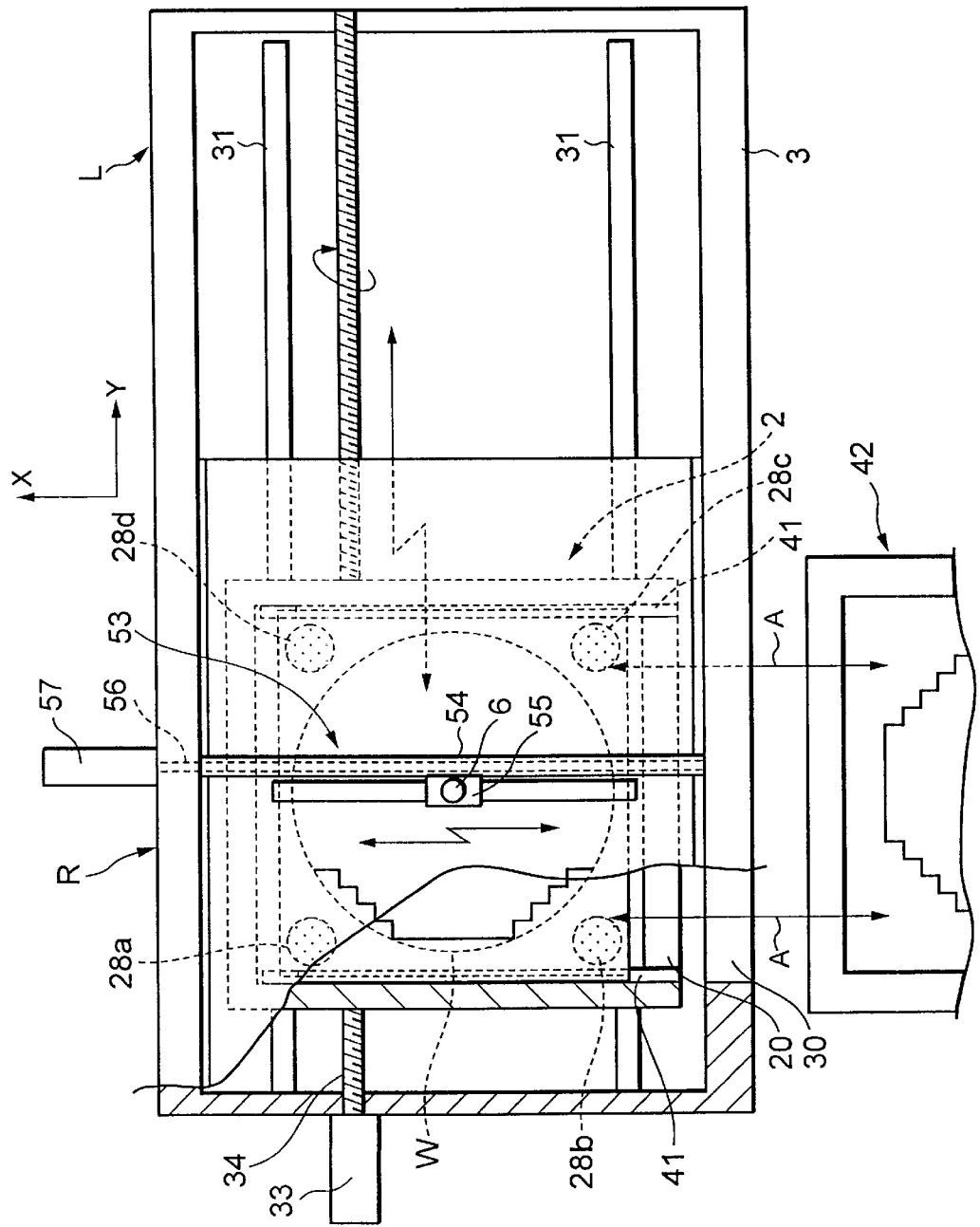
FIG. 2 is a plane view showing the above coating film forming apparatus.

FIG. 1 is a vertical cross-sectional view showing the configuration of the embodiment in which the coating film forming apparatus of the present invention is applied to a resist liquid coating apparatus, which coats a semiconductor wafer (hereinafter referred to as "wafer"), serving as a substrate, with a resist liquid, which is a processing liquid, and FIG. 2 is the plane view.

In FIGS. 1 and 2, reference numeral 2 denotes a wafer holding member, serving as a substrate holding section, and this wafer holding member 2 is held in a frame 3 to be movable in a Y direction. The frame 3 is a member, which is formed in a channel shape, which is released upward, and which has a long length in the Y direction. One end side in the Y direction is structured as a resist liquid coating section R where a resist liquid coating is carried out and other end side is structured as a wafer load/unload section L that performs the delivery of wafer W. The frame 3 also comprises a pair of Y-rails 31, which extends from the resist liquid coating section R to the wafer load/unload section L. The wafer holding member 2 is held on the rails 32 to be movable in the Y-direction by a Y slider 32, and is driven to be freely positioned in the Y-direction through a nut 35 by rotating a ball screw using a Y-drive motor 33.

The wafer holding member 2 has a main body 21, which is cup-shaped, and a wafer absorption table 22 that holds the wafer W. The main body 21 has a liquid reservoir channel 23 for storing a solvent (thinner solution) at a position opposite to the lower surface of wafer W. The liquid reservoir channel 23 is filled with the solvent whose temperature and level are controlled. The solvent is evaporated, whereby keeping the surroundings of wafer solvent in a solvent atmosphere with a predetermined concentration.

The wafer absorption table 22 has a holding section 24 that holds the wafer W on its surface. A vacuum apparatus (not shown) is connected to the holding section 24 so that vacuum chucking can be performed to the wafer W. The holding section 24 is connected to a Zθ-driving mechanism 25. When the wafer holding member 2 is moved to the wafer load/unload section L, a Z-drive/θ-rotational driving section 26 actuates the Zθ-driving mechanism 25 to perform a Z-direction operation for delivering the wafer W and a θ-operation for notch adjustment. Moreover, an ultrasonic oscillator 27, which is connected to an agitation generating section (not shown), for oscillating the absorbed and held wafer W is fixed to the wafer absorption table 22.

Four forceful exhaust ports 28a to 28d, which are connected to an exhausting apparatus (not shown) for controlling an air current in the main body 21, are formed at four corners of the bottom of the main body 21, which surround the wafer absorption table 22 (wafer W). The amounts of exhaust flow from these forceful exhaust ports 28a to 28d are individually controlled. For example, by executing exhaust from only two exhaust ports 28a and 28b, a weak current air, which leans to one side, is generated in the main body 21 to control the flow of the solvent volatilized from the coated resist liquid. This prevents the solvent from being excessively volatilized.

Figure 3:
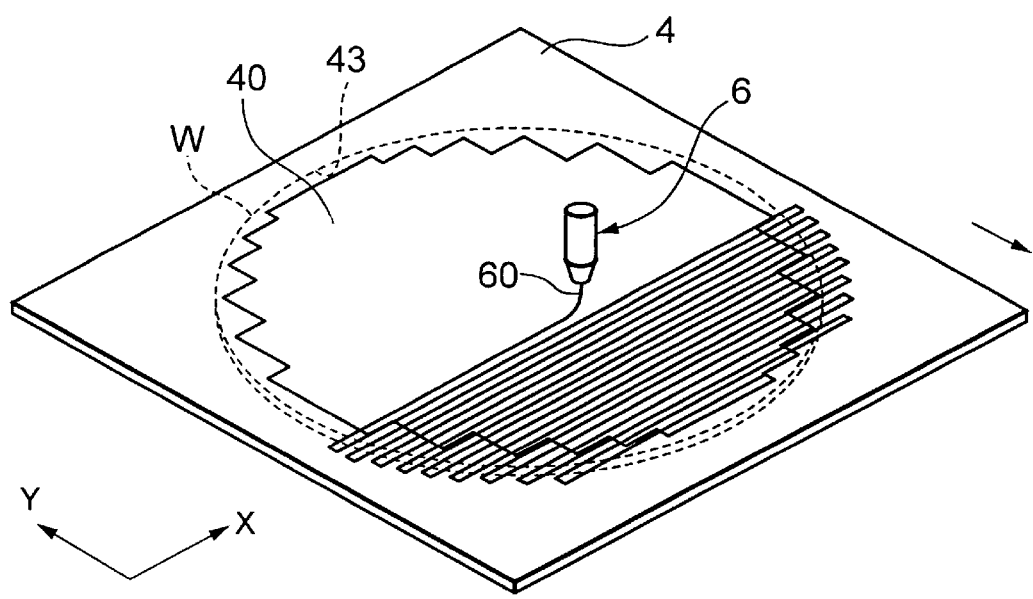
FIG. 3 is a perspective view to explain a resist liquid coating path.

In the wafer holding member 2, a mask member driving mechanism 41 is provided. The mask member driving mechanism 41 holds the mask member 4 at the point right above the wafer W, and drives the mask member 4 in a direction (X-direction) shown by an arrow A of FIG. 2 to insert and remove to/from the wafer holding member 2. The mask member 4 covers regions other than a circuit forming area 40 of the wafer W, and prevents the resist liquid from being applied on the peripheral edge portion of the wafer W as shown in FIG. 3. The mask member driving mechanism 41 takes out the mask member 4 smudged with the resist liquid from the resist coating apparatus through insert/remove paths 20 and 30 formed in the wafer holding member 2 and the frame 3 as shown by an arrow A of FIG. 2, so as to carry the mask member 4 to a mask member cleaning apparatus indicated by 42 in this figure. In addition, reference numeral 43 in FIG. 3 indicates a notch formed in the wafer W.

Reference numeral 5 in the figure indicates a top plate with a temperature adjusting function, which is provided in the frame 3 to cover the upper portion of the wafer holding member 2. The top plate 5 has a linear heater 51 built-in to be heated at a predetermined temperature. As a result, the top plate 5 has a function of maintaining and controlling the solvent atmosphere with which the surroundings of the wafer W is filled and a function of heating a supply nozzle 6 to be described later to prevent the nozzle 6 from being clogged and "stoppage" of the flow of the discharged resist liquid.

The top plate 5 is designed to continue covering the wafer holding member 2 even when the wafer holding member 2 is moved in the Y direction to a maximum with respect to only the resist liquid coating section R. Moreover, a slit 52 for allowing the supply nozzle 6 to move in the X direction is formed in the middle portion in the Y direction of the top plate 5. The slit 52 has a length, which corresponds to the width of the wafer W, and a width, which allows the passage of the supply nozzle 6.

The supply nozzle 6 is supported by a linear slide mechanism 53, which is provided to hang across the upper ends of the frame 3 along the X direction. The linear slide mechanism 53 comprises a slider 55, which is slidably provided on X-rails 54, a ball screw 56 for driving the slider 55, and an X-driving motor 57 for driving the ball screw 56 rotatably. The supply nozzle 6 is supported at a position corresponding to the slit 52 of the top plate 5 by the slider 55, and the lower end portion is extended to the interior of the wafer holding member 2 through the slit 52.

The X-drive motor 57 and Y-drive motor 33 are structured to be actuated in synchronization with each other by a nozzle/wafer driving section 36. The supply nozzle 6 is moved as being opposed to a predetermined path of the wafer W. The operations of the Z-drive/θ-rotational driving section 26 and nozzle/wafer driving section 26 are controlled by the control section C. The linear slide mechanism 53 (X-rails 54, Y slider 55, ball screw 56, X-driving motor 57), which are controlled by the nozzle/wafer driving section 36 and Z-drive/θ-rotational driving section 26, and Y-rails 31, Y-slider 32, Y-driving motor 33, ball screw 34, nut 35, Zθ-driving mechanism 25, and Z-drive/θ-rotational driving section 26 correspond to the driving mechanisms of the present invention.

Figure 4:
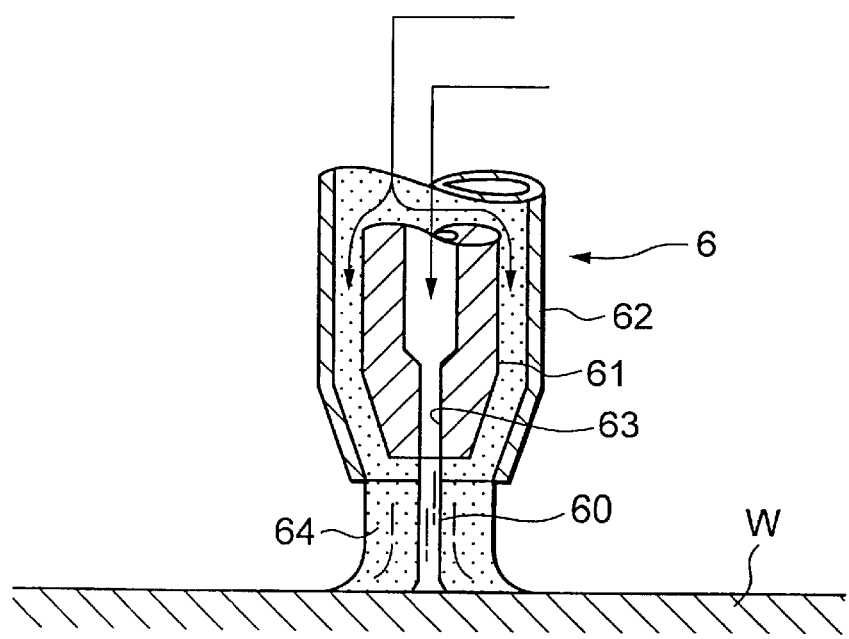
FIG. 4 is a cross-sectional view showing a resist liquid supply nozzle.

An explanation will be next given of the supply nozzle 6 with reference to FIG. 4. For example, the supply nozzle 6 has a double tube structure having an inner tube section and an outer tube section wherein the inner tube section is a resist liquid nozzle 61 for supplying a resist liquid 60 in the form of a linear thin diameter and the outer tube section is a solvent nozzle 62 for supplying a mist-like solvent 64 through the surroundings of the resist liquid nozzle 61. The resist liquid nozzle 61 is formed of, for example, stainless material, and a discharge hole 63 is formed extremely thinly to have a diameter of about 10 $\mu$m to 200 $\mu$m. Such supply nozzle 6 discharges the mist-like solvent 64 to the surroundings of the liquid flow of the resist liquid 60, just after being discharged. This seals the surroundings of the resist liquid flow in the solvent atmosphere to prevent volatilization of the solvent from the resist liquid flow and to keep viscosity constant.

In the supply system of the resist liquid 60, as shown in FIG. 1, the resist liquid 60 stored in a resist liquid tank 65 is supplied to the supply nozzle 6 through a filter apparatus 67 and an open/close valve 68 using a pump 66, for example, a bellow pump, and is discharged from a discharge hole 63. These resist liquid tank 65, pump 66, filter apparatus 67, open/close valve 68, and supply nozzle 6 are connected to one another by a supply path 69. The operations of the pump 66 and the open/close value 68 are controlled by the control section C.

An explanation is next given of an example of the resist liquid coating executed by the above-mentioned apparatus. The feature of the present invention is that movement of the supply nozzle and the wafer W timing at which the resist liquid is supplied to the wafer W from the supply nozzle are controlled such that the coating area of wafer W is divided and the divided regions are coated in a predetermined condition.

Figure 5:
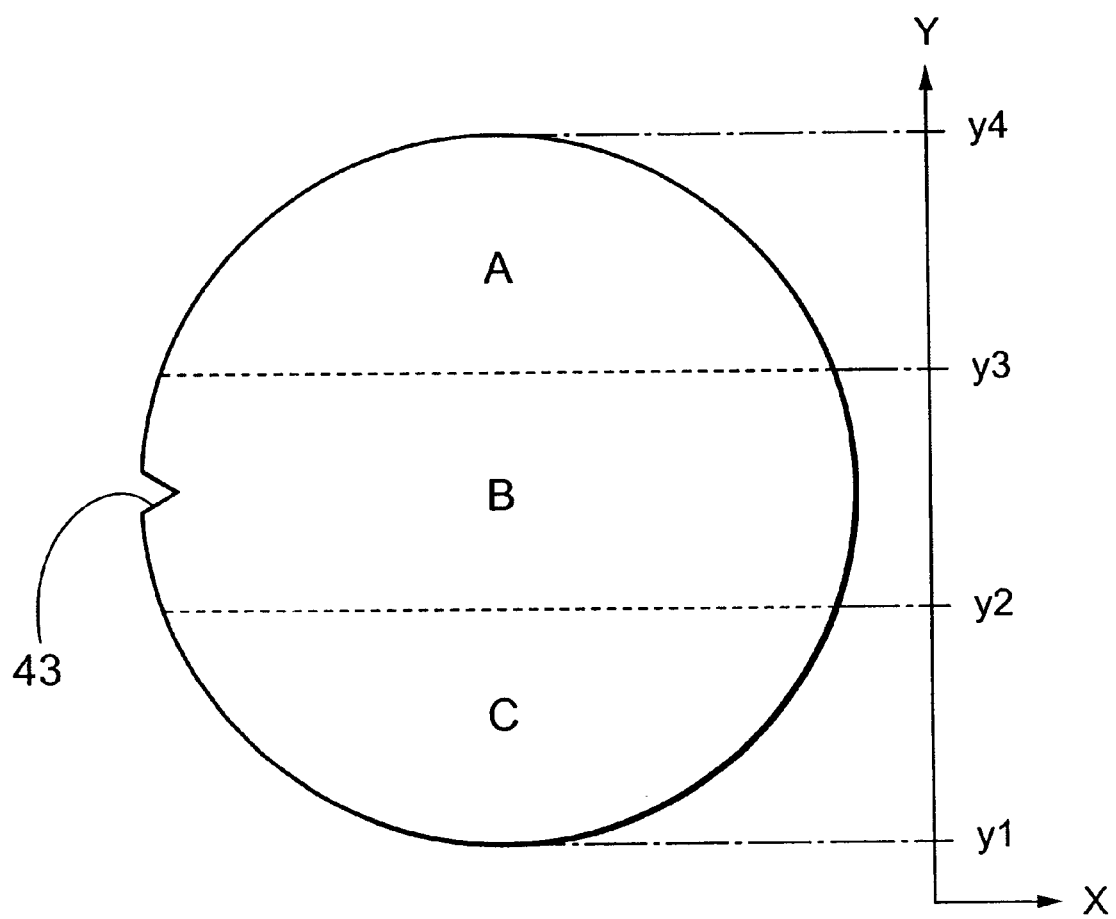
FIG. 5 is a plane view explaining divided regions of a coating area of a wafer W.

Hereinafter, as one example, a specific explanation is given of a case in which the coating area of wafer W is divided into three as shown in FIG. 5. In this example, the wafer W is positioned in a state that the notch 43 is directed left, and the coating area is equally divided into three regions A, B, and C, in the Y-direction.

First, the wafer holding member 2 is positioned at the wafer load/unload section L to move up the holding section 24, whereby delivering the wafer W from a main arm for transferring the wafer (not shown) to the wafer absorption table 22 to absorb and hold the wafer W. Sequentially, the notch adjustment for the wafer W is carried out by the Z-drive/θ-rotational driving section 26, thereafter the holding section 24 is moved down to contain the wafer W into the wafer holding member 2. Next, the wafer holding member 2 is positioned at the resist liquid coating section R, and the mask member 4 is held on the wafer by the mask member driving mechanism 41.

Figure 6A:
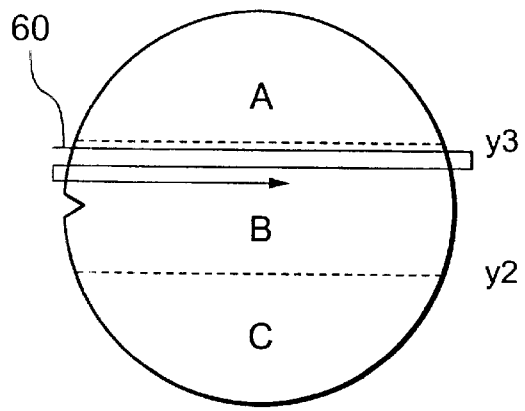
FIG. 6 is a plane view explaining a coating example of the wafer W.

First, as shown in FIG. 6(a), the coating of resist liquid is applied to the region B of wafer W in a coating direction, which is from a coating start position y3 to a coating end position y2. For this reason, the wafer holding member 2 is moved to a direction, which is substantially parallel with one side of the circuit forming area 40, for example, Y-direction, such that the supply nozzle 6 is positioned at a position corresponding to the coating start position y3. Sequentially, the nozzle 6 is moved in a direction, which is substantially orthogonal to one side of the circuit forming area 40, for example, X-direction, as discharging the resist liquid 60 to the wafer W form the supply nozzle 6 after opening the open/close valve 68. For example, as shown in the figure, the supply nozzle 6 is reciprocated in the X-direction again as being intermittently fed in the Y-direction by a predetermined pitch at a point where the nozzle 6 is passed through the circuit forming area 40.

The nozzle 6 is moved to the position corresponding to the coating end position y2 along a zigzag path in a state that the resist liquid 60 is discharged to the wafer W from the supply nozzle 6, whereby forming a uniform liquid film on the region B of wafer W. In this case, movement of the wafer holding member 2 and supply nozzle 6 is controlled through the nozzle/wafer driving section 36 by the control section C, and open/close timing of the open/close valve 68 is also controlled by the control section C.

Figure 6B:
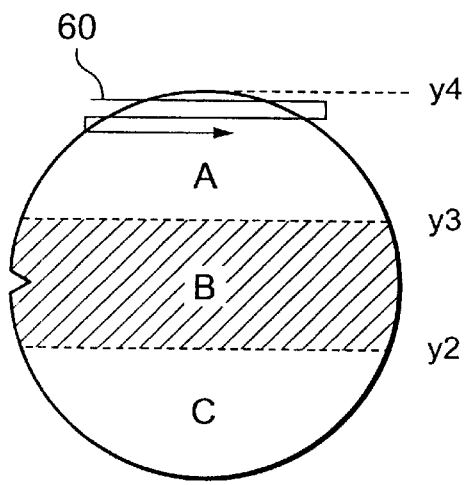

Sequentially, as shown in FIG. 6(b), the coating of resist liquid 60 is applied to the region A of wafer W in a coating direction, which is from a coating start position y4 to a coating end position y3. For this reason, when the coating of the region B is ended, the open/close valve 68 is closed and the wafer holding member 2 is moved in the Y-direction, so that the supply nozzle 6 is positioned at a position corresponding to the coating start position y4. Then, the nozzle 6 is moved to the position corresponding to the coating end position y3 along a zigzag path as discharging the resist liquid 60 to the wafer W from the supply nozzle 6 after opening the open/close valve 68, whereby forming a uniform liquid film on the region A of wafer W.

Figure 6C:
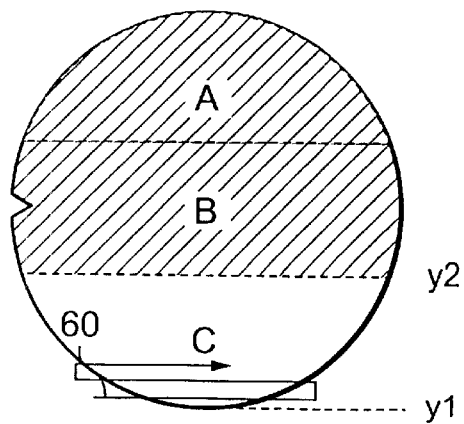

Thereafter, as shown in FIG. 6(c), the coating of resist liquid 60 is applied to the region C of wafer W in a coating direction, which is from a coating start position y1 to a coating end position y2. For this reason, when the coating of the region A is ended, the open/close valve 68 is closed and the wafer holding member 2 is moved in the Y-direction, so that the supply nozzle 6 is positioned at a position corresponding to the coating start position y1. Then, the nozzle 6 is moved to the position corresponding to the coating end position y2 along a zigzag path as discharging the resist liquid 60 to the wafer W from the supply nozzle 6 after opening the open/close valve 68, whereby forming a uniform liquid film on the region C of wafer W, and then the open/close value 68 is closed.

The resist liquid 60, which has been discharged onto the wafer W from the supply nozzle 6 and stayed here, generates a fixed expansion in accordance with its viscosity. For this reason, the feeding pitch in the Y direction, the coating start position and the coating end position of each of the divided regions are appropriately set in accordance with the amount of the expansion, whereby making it possible to form a uniform resist film on each of the divided regions thoroughly.

After performing the coating of resist liquid in this way, the ultrasonic oscillator 27, which is attached to the wafer absorption table 22, is actuated to apply oscillation to the wafer W in an ultrasonic band. This adds agitation to the coated resist liquid film to improve the flattening of the surface of the liquid film.

Thereafter, the mask member 4 to which the resist liquid is adhered is exhausted to the mask member cleaning apparatus 42, and the wafer holding member 2 is carried to the wafer load/unload section L from the resist liquid coating section R. Then, the holding section 24 is moved up to deliver the wafer W to the main arm (not shown), so that the wafer W is unloaded from the corresponding resist liquid coating apparatus.

In the coating film forming apparatus of the present invention, the coating area of wafer W is divided into three, and movement of the supply nozzle 6 and the wafer W and timing at which the resist liquid is supplied to the wafer W are controlled to coat each of the divided regions in a predetermined condition. This makes it possible to improve uniformity of the inner surface of the thickness of the resist film as explained below.

More specifically, as explained above, there occurs the phenomenon in which the resist liquid 60 discharged from the supply nozzle 6 collides with the wafer W, and expands, and is drawn to each coating start position side. However, the coating area of wafer W is divided into the regions A, B and C, respectively, and the coating order and the coating direction (nozzle advancing direction) of each region are set in a predetermined condition as described later. The phenomenon, in which the resist liquid 60 is drawn to the coating start position, so as to increase the film thickness of the portion, occurs in only the corresponding region. Therefore, each of the regions A, B, and C is smaller than the entire coating area of the wafer W, and the amount of resist liquid, which is drawn to the coating start position, is small. For this reason, even if the film thickness at the coating start position is large, such a degree of the film thickness is considerably relaxed as compared with the case in which the wafer W is not divided.

Figure 7A:
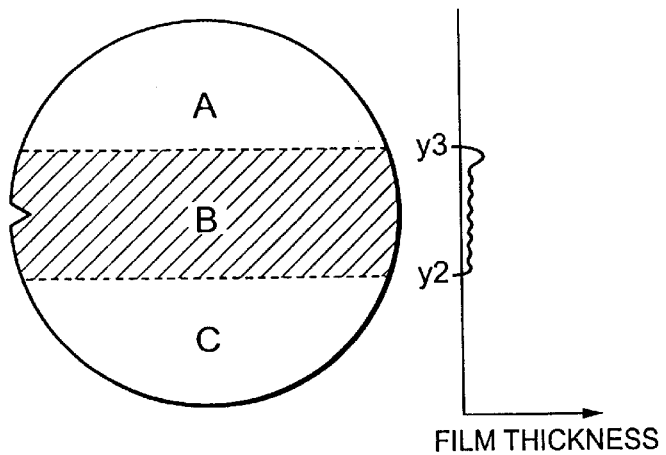
FIG. 7 is a plane view explaining a coating example of the wafer W.
Figure 7B:
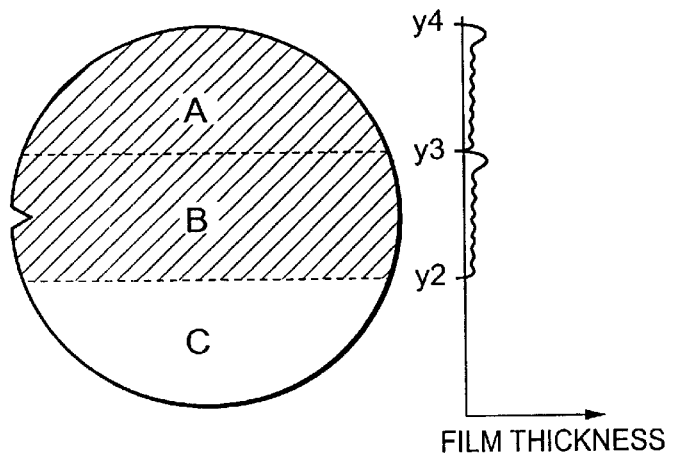
Figure 7C:
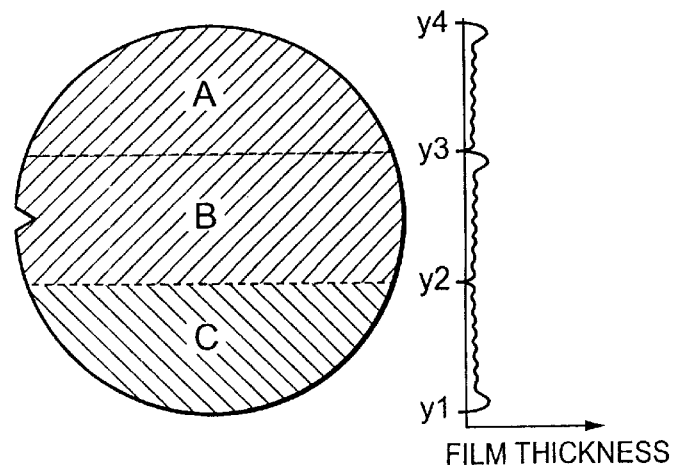

For example, in this example, the film thickness at the coating start position y3 is larger than the film thickness at the coating end position y2 in the region B as shown in FIG. 7(*a*). The film thickness at the coating start position y4 is larger in the region A as shown in FIG. 7(*b*). The film thickness at the coating start position y1 is larger in the region C as shown in FIG. 7(*c*). However, the width of the film thickness distribution is considerably smaller than the case in which the wafer W is not divided, and uniformity of the inner surface of the film thickness is improved.

Regarding the condition of the coating order and coating direction (nozzle advancing direction) of each region, the following explains a case in which the wafer W is divided into a first area 71 and a second area 72 will be explained using FIG. 8. Even if the coating area of wafer W is divided, the resist liquid is drawn to the coating start position as mentioned above. Therefore, if the coating start points of the adjacent coating regions are next to each other, the amount of resist liquid, which is drawn to the boundary portion, is increased and the film thickness of the corresponding portion is conspicuously increased (FIG. 8(*a*)). In this case, arrows in this figure indicate the coating directions.

Figure 8A:
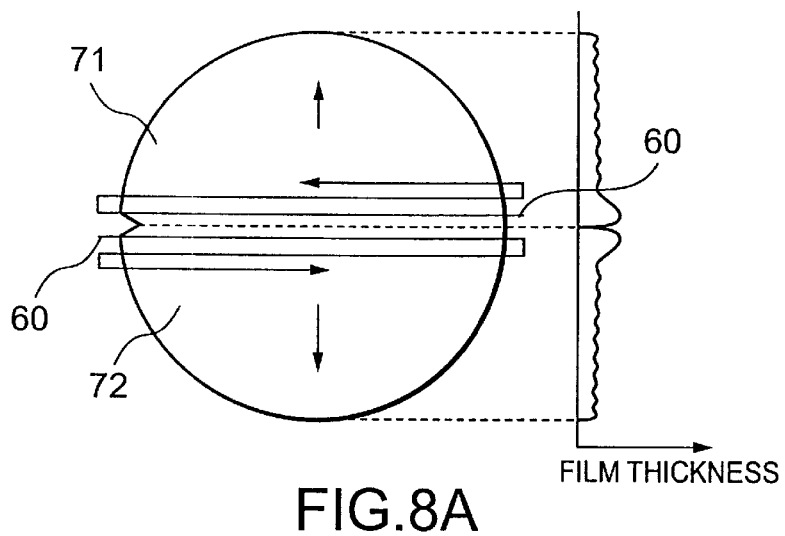
FIG. 8 is a plane view explaining a coating example of the wafer W.
Figure 8B:
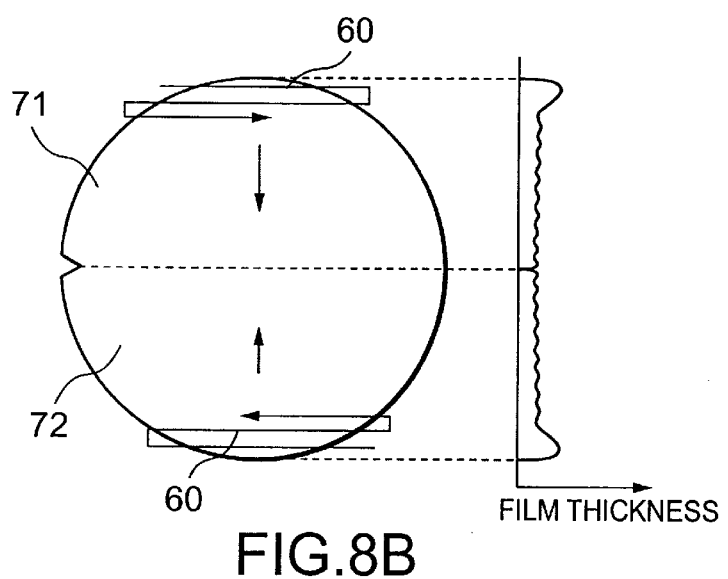
Figure 8C:
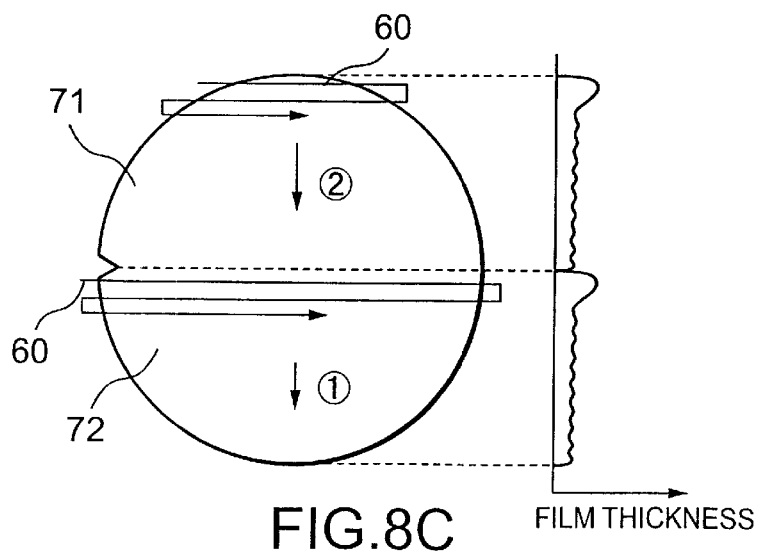

Therefore, in order to improve uniformity of the inner surface of the film thickness, it is required that the coating direction be decided such that the coating start points of the adjacent coating regions are not next to each other as shown in FIG. 8(*b*), or that the coating order and the coating direction be decided as shown in FIG. 8(*c*).

In the example shown in FIG. 7, the coating start position y4 of region A is decided to be separated from the coating start position y3 of region B (the coating direction of the region A is decided), and the coating direction of region C is decided such that the coating start position y1 of region C is separated from the coating start position y3 of region B, with the result that uniformity of the inner surface of the film thickness is increased.

Moreover, it is assumed that the coating end position of the first area 71 and the coating start position of the second area 72 are adjacent to each other as in the case in which the coating directions of the adjacent regions are the same as each other as shown in FIG. 8(*c*). If the coating order is set to perform the coating continuously from the first area 71 to the second area 72, these two regions are coated together. Resultantly, the resist liquid is drawn to the coating start position of the first coating area and the film thickness of this part is considerably increased.

In this case, the coating order is set not to perform the coating continuously from the coating end position of the first area 71 to the coating start position of the second area 72. Then, the second area is coated. Thereafter, in order to coat the first area, movement of the supply nozzle 6 and the wafer W and timing at which the resist liquid is supplied to the supply nozzle 6 by the opening/closing the open/close valve 68 are controlled.

In this way, the coating direction is decided such that the coating start points of the adjacent coating regions are not next to each other. Moreover, the coating order is set not to perform the coating continuously from the coating end position of the front side of the coating direction (the first area in the example of FIG. 8(*c*)) to the coating start position of the preceding side of the coating direction (the second area in the example of FIG. 8(*c*)) in the case where the coating directions of the adjacent regions are the same as each other. Whereby, it is possible to improve uniformity of the inner surface of the thickness of the resist film as mentioned above and the coating order and the coating direction can be freely set within this range.

Figure 9A:
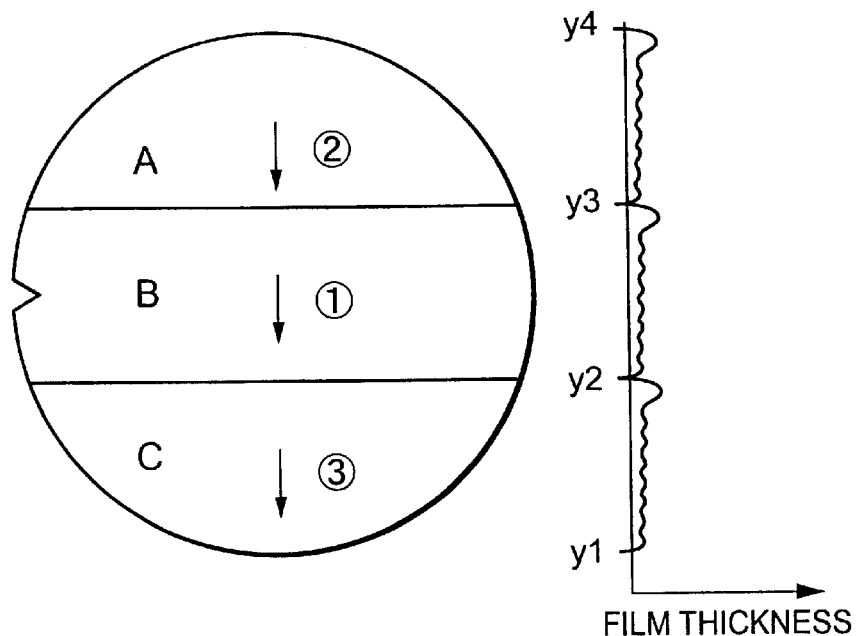
FIG. 9 is a plane view explaining a coating example of the wafer W.
Figure 9B:
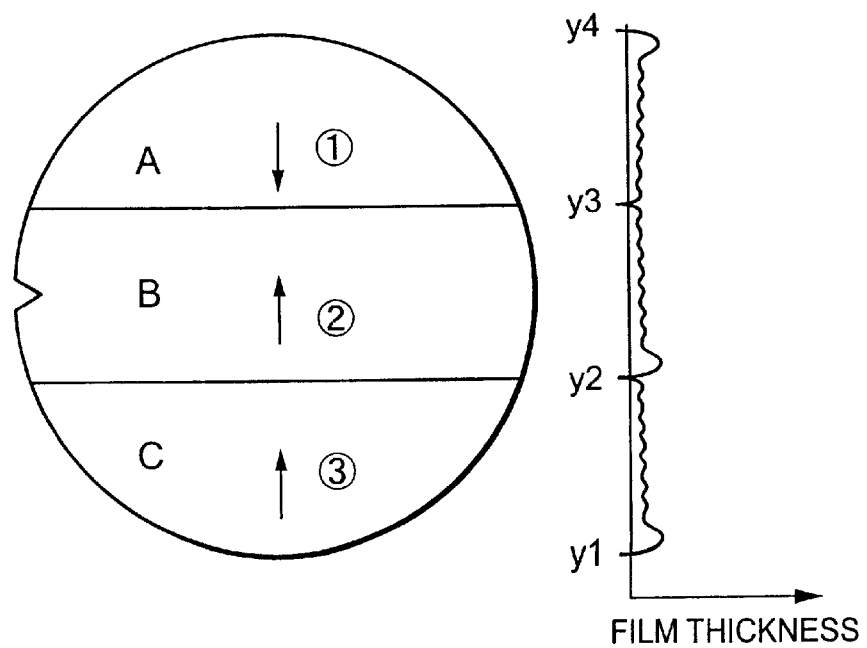

The above-mentioned example in which the wafer W is divided into three is not limited to the aforementioned conditions. For example, as shown in FIG. 9(*a*), the region B is first coated in the coating direction from the coating start position y3 to the coating end position y2, thereafter, the region A is coated in the coating direction from the coating start position y4 to the coating end position y3, sequentially, the region C may be coated in the coating direction from the coating start position y2 to the coating end position y1. Or, for example, as shown in FIG. 9(*b*), the region A is first coated in the coating direction from the coating start position y4 to the coating end position y3, thereafter, the region B is coated in the coating direction from the coating start position y4 to the coating end position y3, sequentially, the region C may be coated in the coating direction from the coating start position y1 to the coating end position y2. Even such coating can obtain high uniformity of the inner surface of the film thickness.

Thus, since the present invention can improve uniformity of the inner surface of the film thickness at the time of coating the resist film, productivity of the resist film can be improved. Also, uniformity of the film thickness can be improved by controlling the coating direction and the coating order. This eliminates the need for controlling profiles such as substrate temperature, which has been conventionally performed to improve uniformity of the film thickness, whereby making it possible to improve a reduction in the cost of the apparatus itself.

Regarding the other coating example of the present invention, the following specifically explains an example in which the coating area of wafer W is divided into five as shown in FIG. 10. In this example, the wafer W is positioned in a state that the notch 43 is directed left, and the coating area is divided into three in the Y direction and the central region thereof is further divided into three in X direction, with the result that the coating area is divided into five regions A, B, C, D, and E.

Figure 10A:
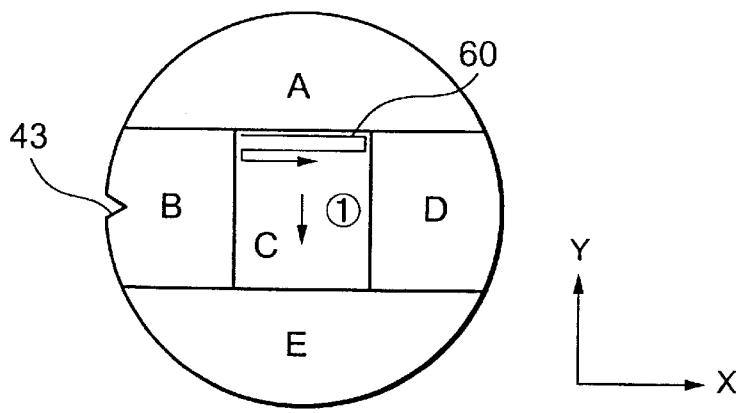
FIG. 10 is a plane view explaining another coating example of the wafer W.
Figure 10B:
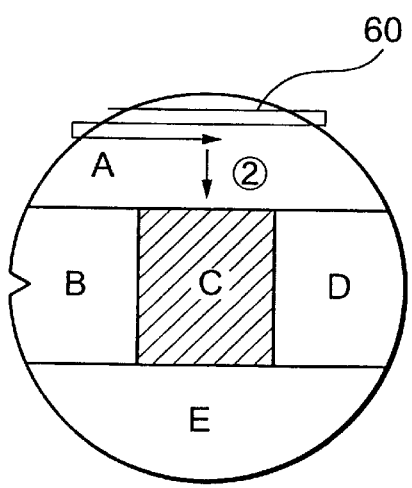
Figure 10C:
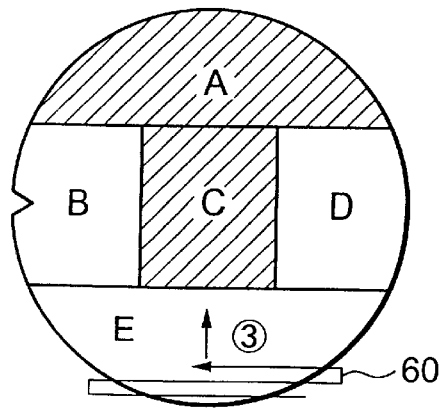

First, as shown in FIG. 10(a), a coating start position is set at a portion close to the region A, and the coating of resist liquid 60 is applied to the region C of wafer W in the coating direction advancing toward the region E therefrom. Next, as shown in FIG. 10(b), a coating start position is set at a portion away from the region C, and the coating of resist liquid 60 is applied to the region A of wafer W in the coating direction advancing toward the region C therefrom. Then, as shown in FIG. 10(c), a coating start position is set at a portion away from the region C, and the coating of resist liquid 60 is applied to the region E of wafer W in the coating direction advancing toward the region E side therefrom.

Figure 11A:
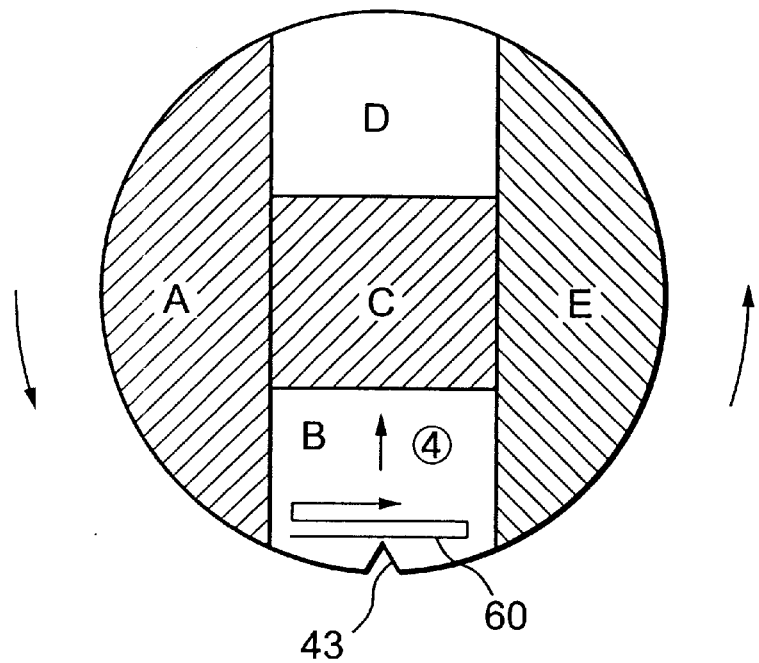
FIG. 11 is a plane view explaining another coating example of the wafer W.
Figure 11B:
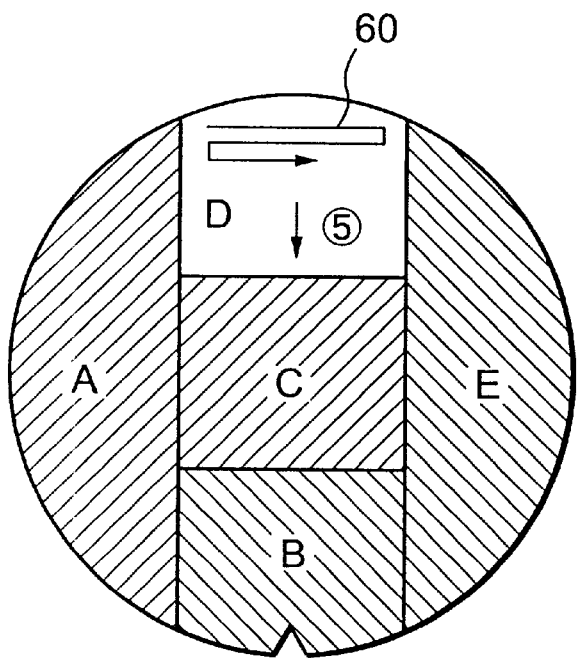

Thereafter, as shown in FIG. 11(a), the wafer W is rotated left at 90° such that the notch 43 is directed downwardly. Then, a coating start position is set at a portion away from the region C, and the coating of resist liquid 60 is applied to in the region B of wafer W, in the coating direction advancing toward the region C side therefrom. Finally, as shown in FIG. 11(b), a coating start position is set at a portion away from the region C, and the coating of resist liquid 60 is applied to the region D of wafer W, in the coating direction advancing toward the region C side therefrom. In this case, movement of the supply nozzle 6 and the wafer holding member 2, and the rotation of wafer W are controlled through the nozzle/wafer driving section 36 and the a Z-drive/θ-rotational driving section 26 by the control section C. Timing at which the resist liquid 60 is supplied from the supply nozzle 6 is also controlled by the control section C.

Figure 12:
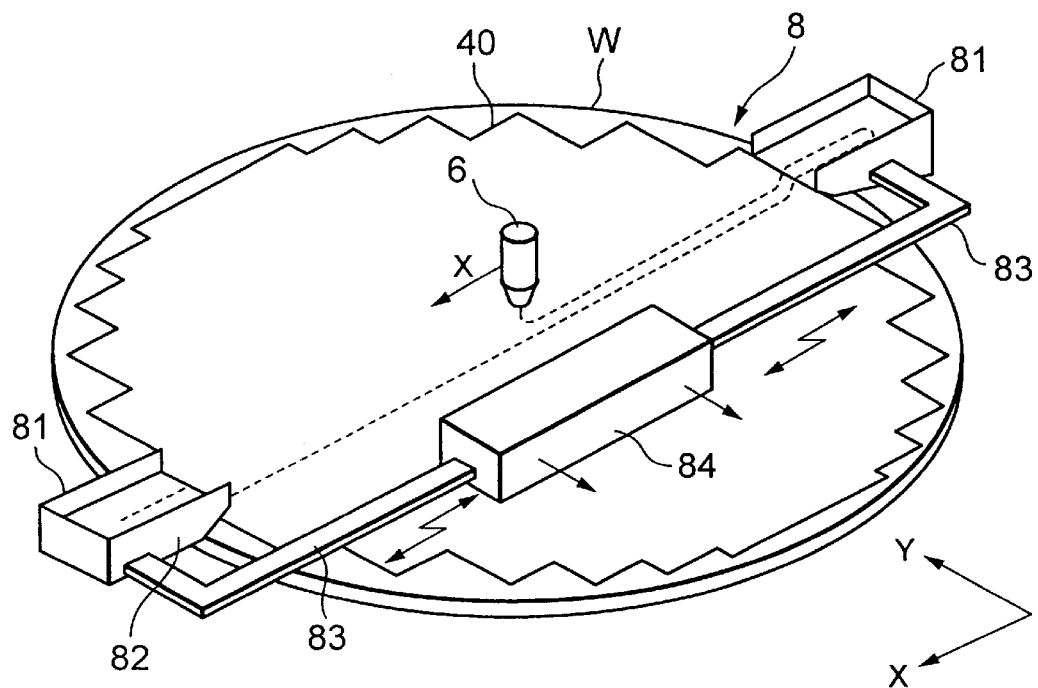
FIG. 12 is a perspective view showing other example of a mask member.

In this example, the moving width of the supply nozzle 6 in the X direction in the regions B, C, and D is smaller than that of the regions A and E. For this reason, the mask material, whose size of the opening portion is changed in accordance with the reciprocation stroke in the X direction of the supply nozzle 6 is desirably used. As such mask material, the structure as shown in, for example, FIG. 12 can be used. In this example, the mask member 8 has a pair of receiving members 81, 81, spaced from each other along the X direction. The receiving members 81, 81 are driven such that the space therebetween is changed in accordance with the stroke in the X direction of the supply nozzle 6 and they are always positioned at a turning point of the supply nozzle 6.

For example, as shown in the figure, the receiving members 81, 81 have side walls 82, each which has an upper surface side formed in a channel shape and prevents the resist liquid from running except its tip end surface. Then, the receiving members 81, 81 are structured such that the resist liquid, which is transmitted from the tip end surface, is absorbed and removed through an absorption hole (not shown).

Then, the receiving members 81, 81 are connected to a receiving member driving mechanism 84 through an L-shaped arm 83 extended along, for example, the X direction. The driving mechanism 84 is fixed to the linear slide mechanism indicated by 53 in FIGS. 1 and 2, and moves in the Y direction together with the linear slide mechanism 53. As receiving member driving mechanism 84, for example, a stepping motor and a linear gear can be used. The receiving member driving mechanism 84 is also connected to the control section C to control the space between the receiving members 81 and 81 to substantially conform to the stroke of the supply nozzle 6 in the X direction, that is, the width of regions B, C, D in the X direction.

Even in this example, the feeding pitch in the Y direction, the coating start position and the coating end position of each of the divided regions are appropriately set in accordance with the amount of the expansion of the resist liquid on the wafer W, whereby making it possible to form a uniform resist film on each of the divided areas thoroughly.

In this example, the coating area of wafer W is divided into five. However, the coating order and the coating direction are set such that the coating start points of the adjacent coating regions are not next to each other and such that the coating is not continuously performed from the coating end position of the front side of the coating direction to the coating start position of the preceding side of the coating direction. Whereby, uniformity of the inner surface of the thickness of the resist film can be improved. In this case, the above example is structured such that the supply nozzle 6 is moved in only the X direction. However, the coating direction and the moving direction of the supply nozzle 6 can be aligned by rotating the wafer W. This makes it possible to carry out the coating in the set coating order and coating direction.

Figure 13A:
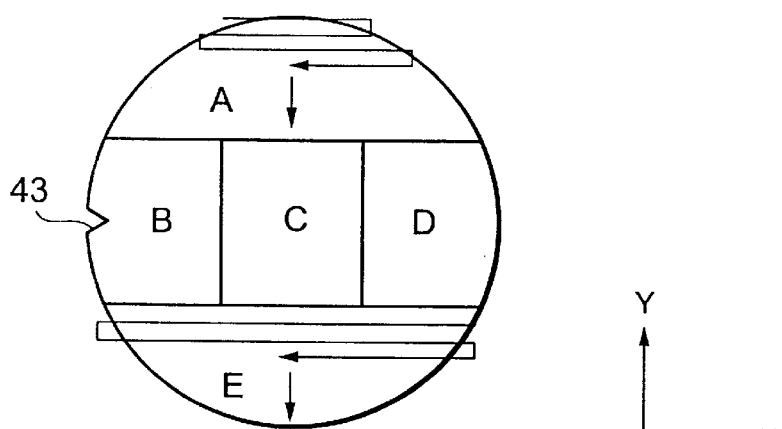
FIG. 13 is a plane view explaining another coating example of the wafer W.
Figure 13B:
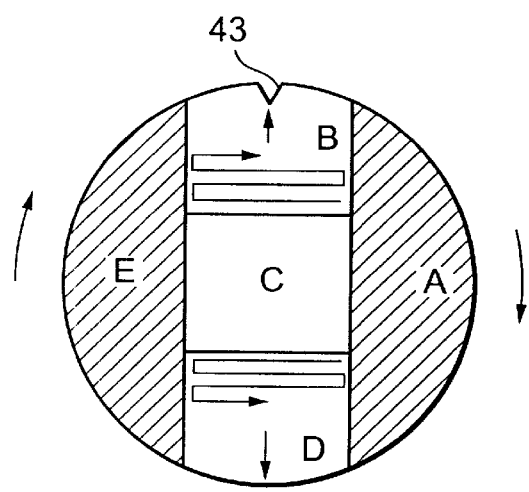
Figure 13C:
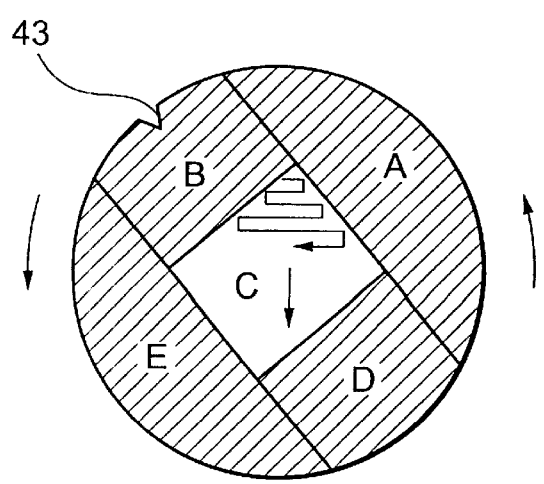

Since the coating area of wafer W is divided into five, the area of each of the divided regions is more reduced, and the width of the film thickness distribution of the resist liquid in the divided region is made small. This makes it possible to carry out coating processing of the resist liquid with higher uniformity of the inner surface of the film thickness, FIG. 13 is another example in which the coating area of wafer W is divided into five. First, as shown in FIG. 13(a), the region A is coated in the coating direction advancing toward the region C from the peripheral edge side of wafer W. Then, the region E is coated in the coating direction advancing toward the peripheral edge side of wafer W from the region C. Sequentially, as shown in FIG. 13(b), the wafer W is rotated at 90° clockwise, and the region B is coated in the coating direction advancing toward the peripheral edge side of wafer W from the region C. Then, the region D is coated in the coating direction advancing toward the peripheral edge side of wafer W from the region C. Finally, as shown in FIG. 13(c), the wafer W is rotated at 45° counterclockwise, and the residual region C is coated in the coating direction advancing toward the regions D and E from the regions A and B, that is, the direction at 45° diagonally to one side of the circuit forming area.

Even in this example, the feeding pitch in the Y direction, the coating start position and the coating end position of each of the divided areas are appropriately set in accordance with the amount of the expansion of the resist liquid on the wafer W, whereby making it possible to form a uniform resist film on each of the divided regions thoroughly.

Moreover, the coating order and the coating direction are set such that the coating start points of the adjacent coating regions are not next to each other and such that the coating is not continuously performed from the coating end position of the front side of the coating direction to the coating start position of the preceding side of the coating direction. Whereby, uniformity of the inner surface of the film thickness can be improved. Additionally, in the final region C, the respective turning positions of the nozzle operation are equally distributed to the regions A, B, D, and E around the region C. For this reason, when the resist at the turning position and the resist applied to each of the regions A, B, D, and E are mixed with each other, the amount of a rise in the mixed portion may be small, so that a uniform film can be formed.

Figure 14:
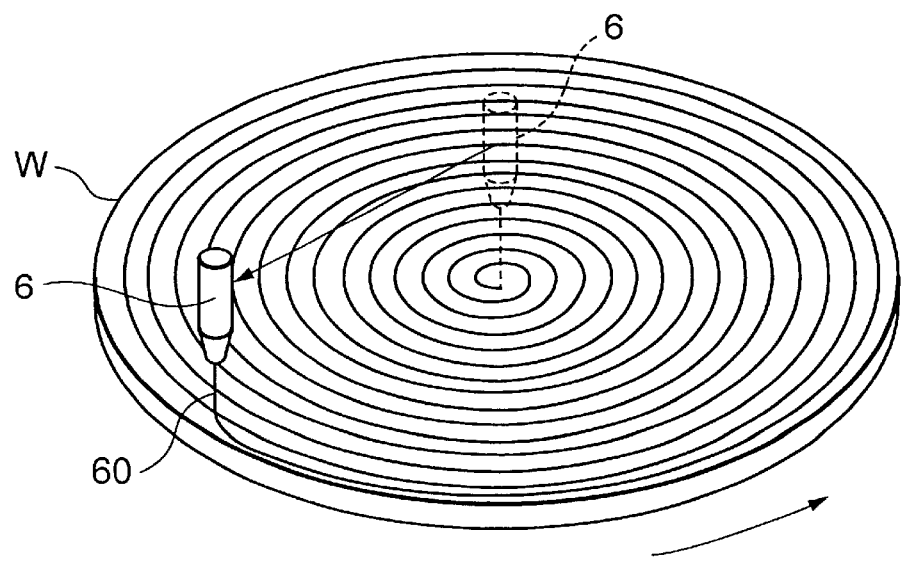
FIG. 14 is a plane view explaining further another coating example of the wafer W.

Regarding more another coating example of the present invention, an explanation is next given of a case in which the coating path of resist liquid 60 is formed in, for example, a spiral fashion as shown in FIG. 14. Such a coating path can be attained by moving the supply nozzle 6 in a diametrical direction of wafer W (for example, X direction) as rotating the wafer W at low speed of, e.g., 20 to 30 rpm.

Such a coating example is explained using an example in which the coating area is divided into two in a diametrical direction, a region A including a central portion, and a region B, which is a peripheral edge portion. First, a coating start position is set at the peripheral edge portion and the coating of resist liquid 60 is applied to the region B of wafer W in the direction moving inwardly in the figure as if a spiral directing to the central portion from the edge portion were drawn. Next, a coating start position is set at the central portion and the coating of resist liquid 60 is applied to the region A of wafer W in the direction moving outwardly in the figure as if a spiral directing to the peripheral edge portion in the figure were drawn. In this case, the feeding pitch in the Y direction, the coating start position and the coating end position of each of the divided regions are appropriately set in accordance with the amount of the expansion of the resist liquid on the wafer W, whereby making it possible to form a uniform resist film on each of the divided regions thoroughly.

Figure 15A:
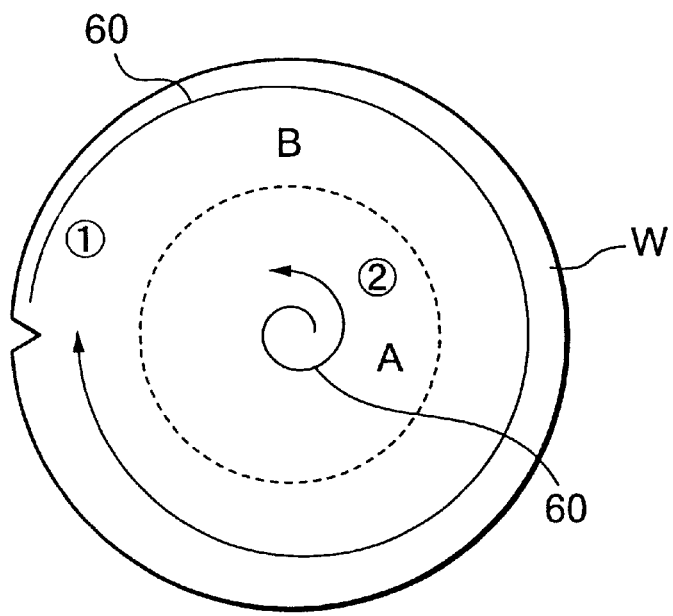
FIG. 15 is a plane view explaining further another coating example of the wafer W.
Figure 15B:
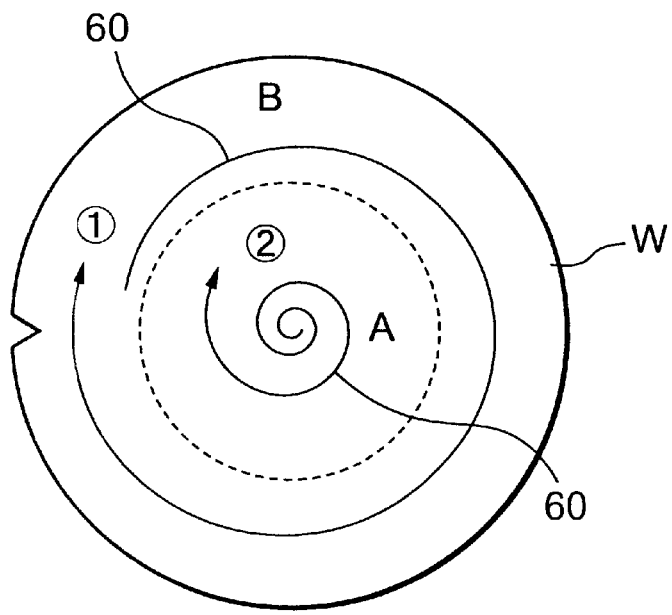

Even in this example, the coating start points of the adjacent coating regions are not next to each other, and the coating is not continuously performed from the coating end position of the front side of the coating direction to the coating start position of the preceding side of the coating direction. For this reason, uniformity of the inner surface of the thickness of the resist film to be formed can be improved. Thus, any coating may be performed if the coating order and the coating direction are set such that the coating start points of the adjacent coating regions are not next to each other and such that the coating is not continuously performed from the coating end position of the front side of the coating direction to the coating start position of the preceding side of the coating direction. For example, as shown in FIG. 15(b), a coating start position is set at the central portion and the coating of resist liquid 60 is applied to the region B of wafer W in the direction moving outwardly in the figure as if a spiral directing to the peripheral edge portion from the central portion were drawn. Next, a coating start position is set at the central portion and the coating of resist liquid 60 may be applied to the region A of wafer W in the direction moving to the peripheral edge portion outwardly in the figure as if a spiral directing to the peripheral edge portion in the figure were drawn.

Figure 16:
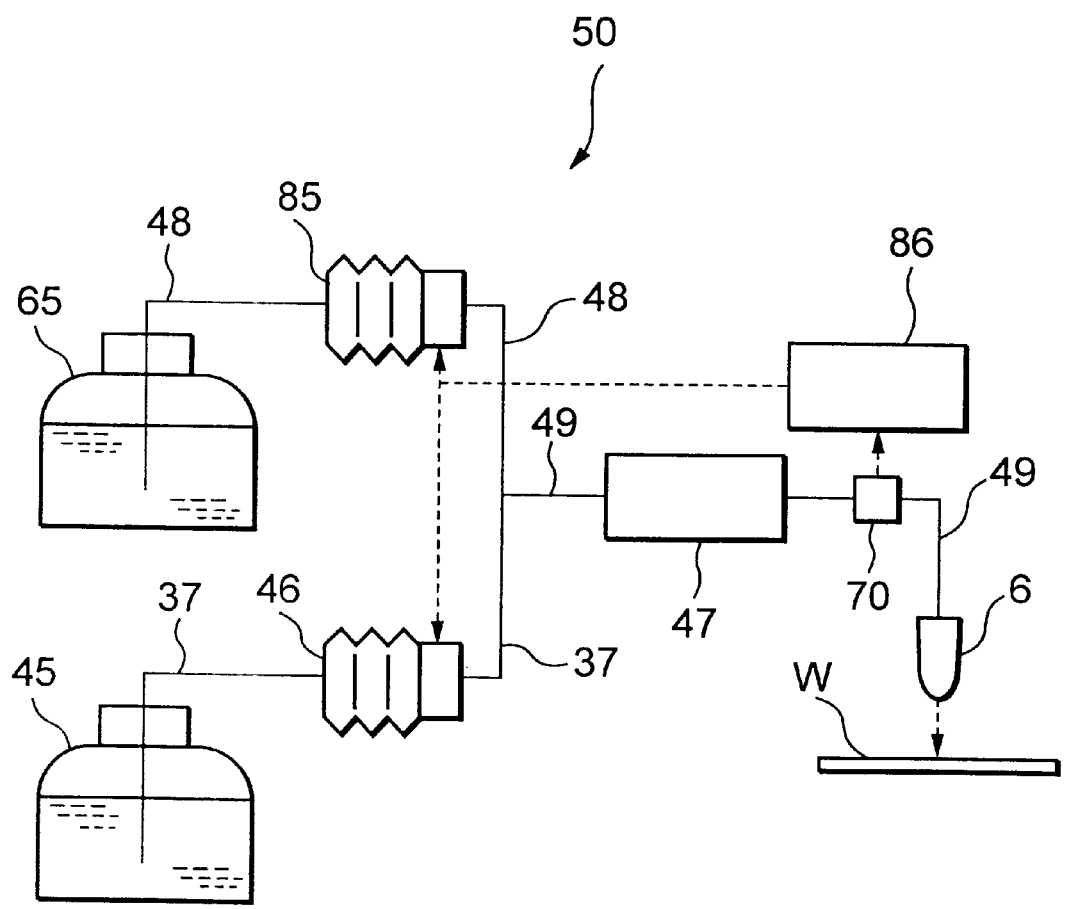
FIG. 16 is a control configuration view showing a mixing apparatus for varying viscosity of a resist.

FIG. 16 shows a mixing apparatus 50 for generating resists each having different viscosity in the case of coating a different resist for each region, for example, resist liquids each having different viscosity. This apparatus comprises the resist tank 65 shown in FIG. 1, a thinner tank 45 storing thinner, a mixer supply pipe 49 for supplying a mixture of resist liquid and thinner to the supply nozzle 6, a resist liquid supply pipe 48 for supplying resist liquid to the mixture supply pipe 49, a thinner supply pipe 37 for supplying thinner to the mixture supply pipe 49, a resist bellow pump 85 for introducing the resist liquid in the resist tank 65 into an absorption resist supply pipe 48, a thinner bellow pump 46 for absorbing thinner in the thinner tank 45 to be introduced into the thinner supply pipe 37, a mixer 47 for further stirring the mixture of resist liquid and thinner, a viscosity sensor 70 for measuring viscosity of the mixture stirred by the mixer 47, and a control section 86 for controlling an operation quantity of the resist bellow pump 85 and that of the thinner bellows pump 46 using, for example, an linear actuator and the like. The measuring result obtained by the viscosity sensor 70 is inputted to the control section 86, and both the bellow pumps 85 and 46 are controlled based on the measurement result. Thus, the resist and thinner are mixed by the mixing apparatus 50 to change viscosity of the resist appropriately, and to supply the resist having different viscosity for each region. As viscosity sensor 70, there is a torsion oscillator using a piezoelectric ceramics as a driving source.

According to such a method, in the case where different ICs are formed on one wafer W, for example, five kinds of application-specific integrated circuits. (ASIC) are formed on the respective regions on one wafer W, the coating of resist having viscosity, which is suitable for an IC of each of regions (five divided regions), can be applied. Namely, since the resist with different viscosity has a different concentration, the sensitivity of light differs at the time of light-exposure processing of wafer W, so that the coating of the resist with viscosity suitable to IC of each region can be applied.

Figure 17A:
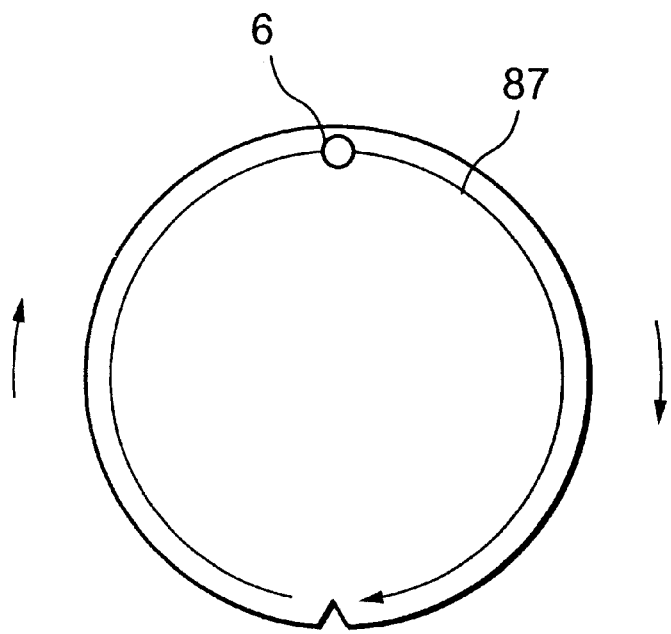
FIG. 17 is a plane view showing a coating example when the coating is performed using the mixing apparatus shown in FIG. 16.
Figure 17B:
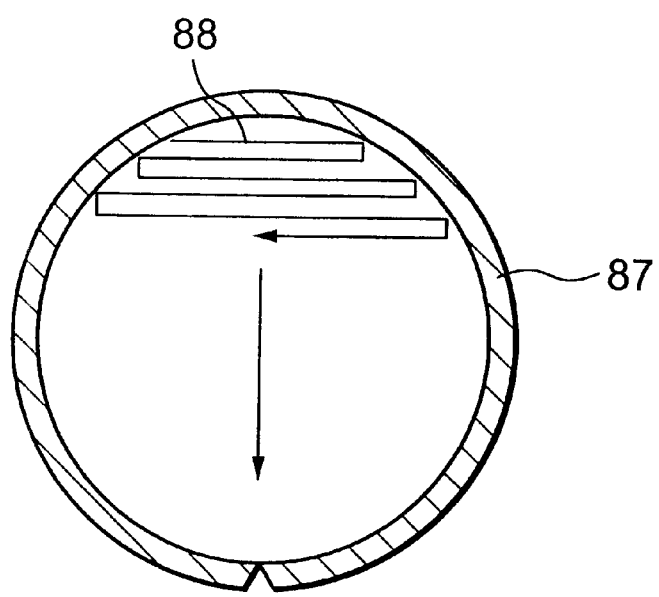

For example, in a state that the nozzle 6 is stopped and fixed on the peripheral edge of wafer W using such mixing apparatus 50 as shown in FIG. 17(a), the coating of resist is applied to the peripheral edge portion of wafer W as rotating the wafer W at low speed of 20 to 30 rpm (reference numeral 87). Then, as shown in FIG. 17(b), the coating of resist is applied to the regions other than the peripheral edge portion as moving the nozzle 6 as indicated by reference numeral 88. At this time, viscosity of the resist to be applied to the peripheral edge portion is set to be higher than that of the resist 88 to be applied to the regions other than the peripheral edge portion. Thus, viscosity of the resist on the peripheral edge portion of wafer W is highly set, so that "bank" of the resist can be formed the peripheral edge portion, to prevent occurrence of a problem in which the resist flows from the peripheral edge portion of wafer W.

Figure 18A:
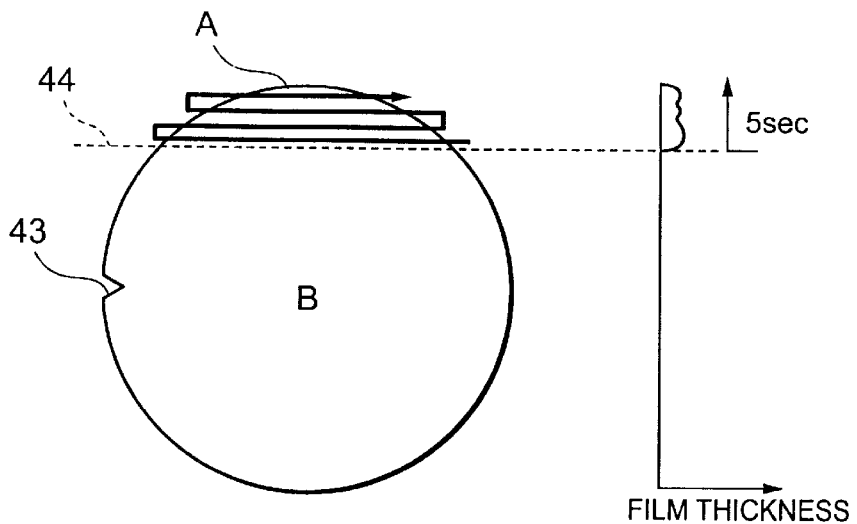
FIG. 18 is a plane view showing another coating example when the coating is performed using the same mixing apparatus.
Figure 18B:
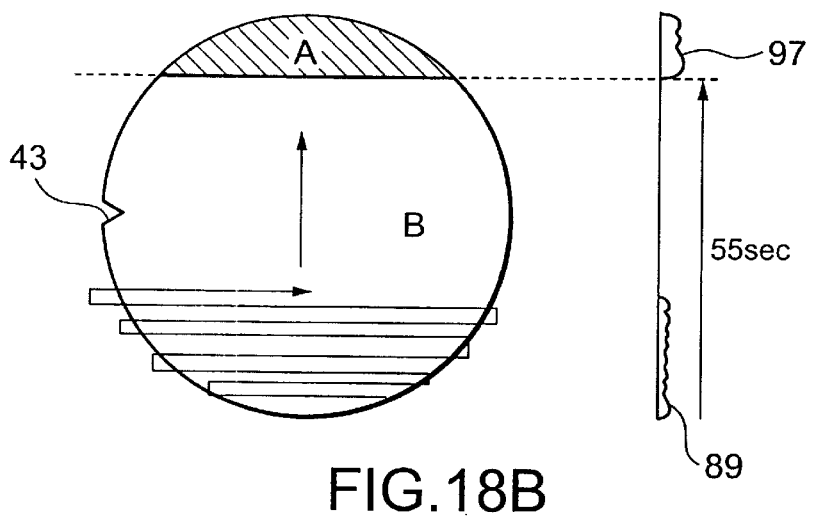
Figure 18C:
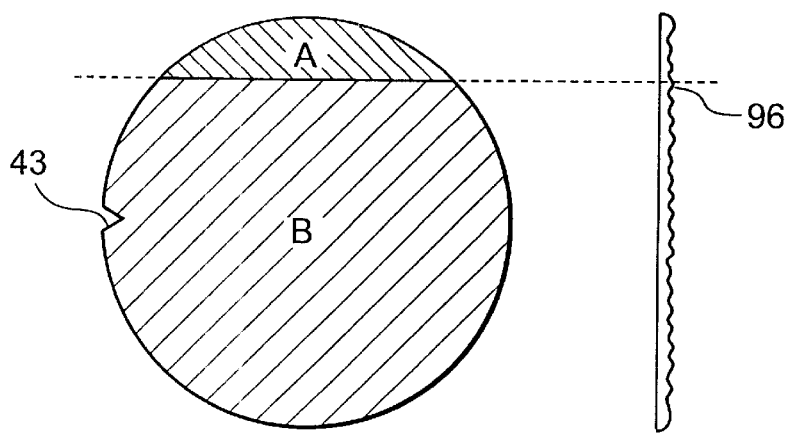

Moreover, it is possible to vary the discharge quantity of the resist, which is discharged from the nozzle 6 per unit of time (hereinafter simply referred to as discharge quantity) by controlling only the operation quantity using only the resist bellow pump 85, in addition to viscosity of the resist. For example, as shown in FIG. 18(a), the coating area on the wafer W is shifted by a center position (notch portion 43), and is divided at a position of a division line 44 indicated by a broken line. First, the coating is applied to the region A with a small area, in the coating direction moving to the peripheral edge portion of wafer W from the division line 44. Then, the coating is applied to the region B with a large area, in the coating direction moving to the division line from the peripheral edge portion of wafer W as shown in FIG. 18(b). In this case, coating time relating to the region A is, for example, 5 seconds. While, coating time relating to the region B is, for example, 55 seconds. The discharge quantity of resist to be applied to the region B is set to be smaller than that of resist to be applied to the region A, that is, ½. This makes it possible to form the "bank" of the resist in the region A, first. Next, the region B is coated with a small discharge quantity of resist to make it possible to reduce the amount of resist, which is drawn to the reference numeral 88 indicative of the coating start portion. Moreover, at the coating end point (reference numeral 96) shown in FIG. 18(c)), the end point 96 and a discharge start part 97 are mixed with each other with the discharge quantity, which is larger than that of the region B in the region A, with the result that uniform coating can be attained as a whole as shown in FIG. 18(c).

In the above-explained examples, though moving speed (scanning speed) of the nozzle 6 is fixed, it is possible to vary this moving speed. Whereby, the film thickness can be adjusted by changing the scanning speed for each region on the wafer W to vary the amount of resist to be supplied on to the region on the wafer W. This makes it possible to obtain a uniform film thickness.

The adjustment of the scanning speed and that of the discharge quantity, or that of the film thickness by the resist viscosity adjustment will be specifically explained as follows.

Figure 19:
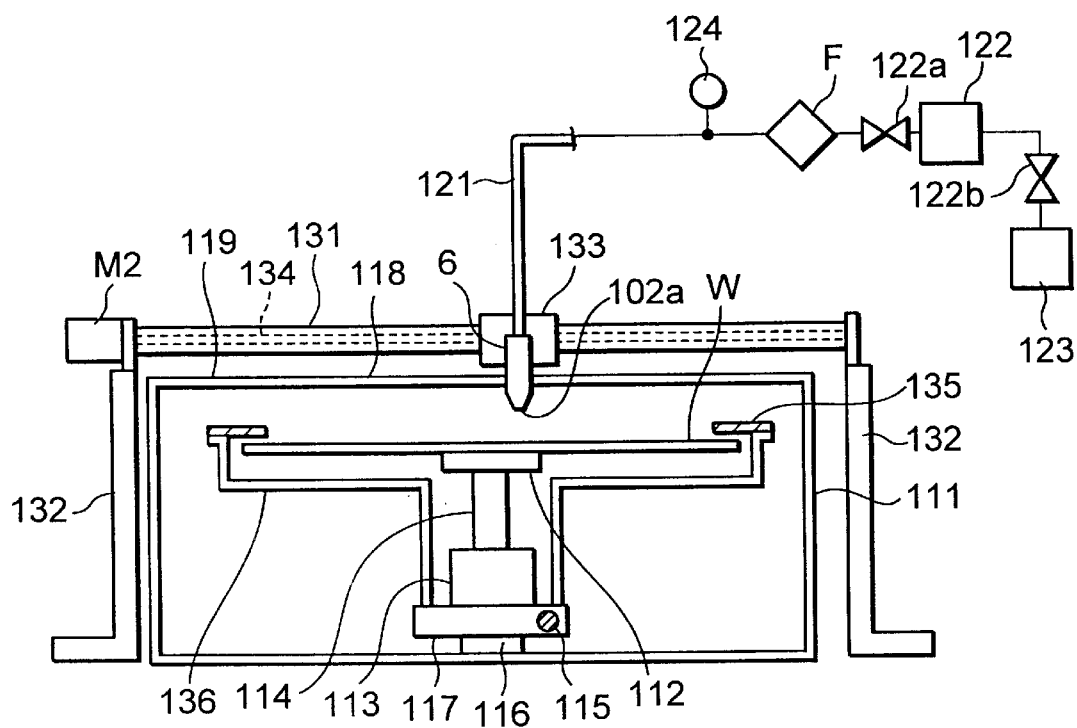
FIG. 19 is a cross-sectional view showing a mechanical part of the coating film forming apparatus according to the embodiment of the present invention.
Figure 20:
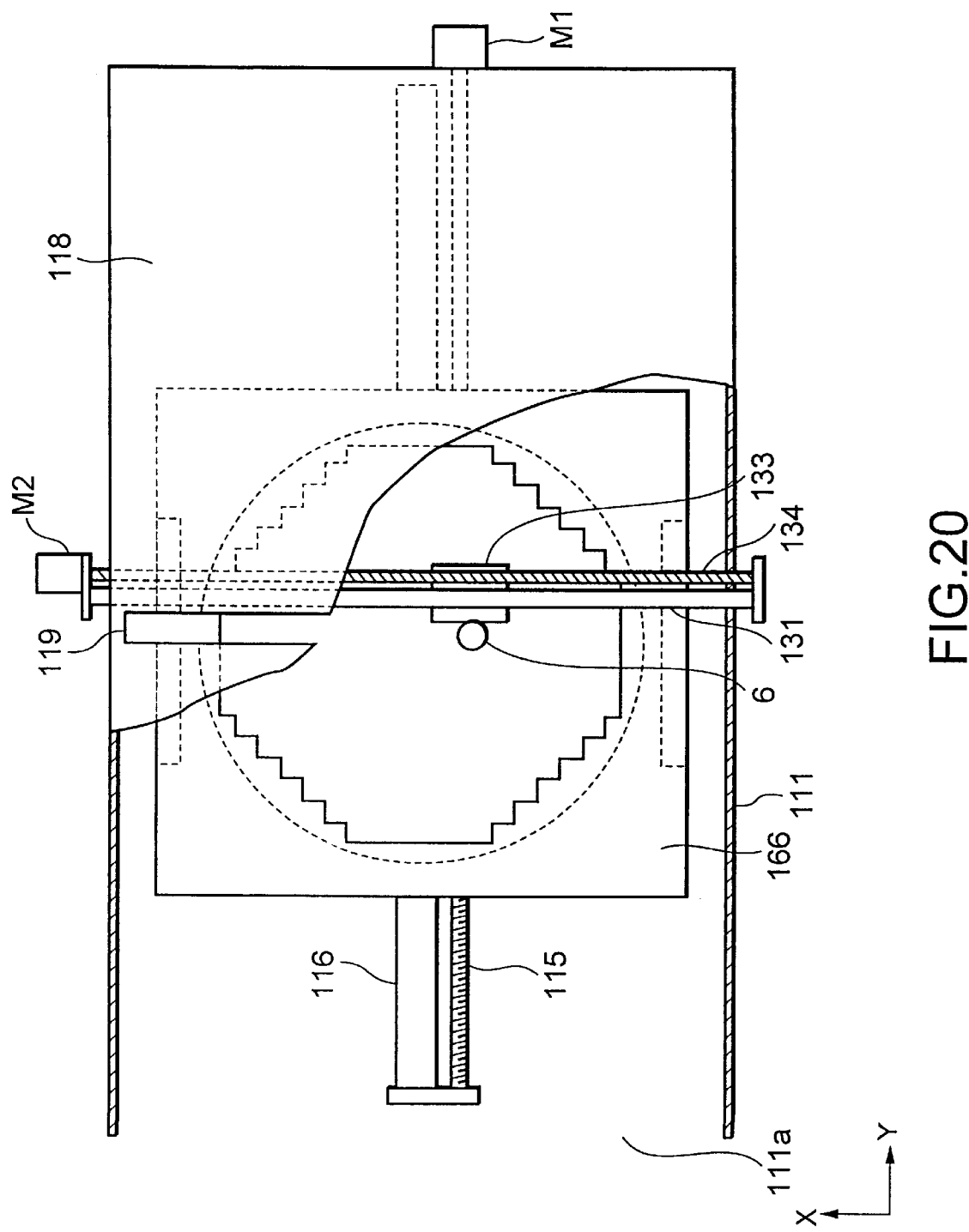
FIG. 20 is a cross-sectional view showing a mechanical part of the coating film forming apparatus according to the embodiment of the present invention.

The following will explain the embodiment in which the coating film forming apparatus of the present invention is applied to the resist film forming apparatus. The main feature of this embodiment lies in the point that how a parameter for controlling movement of the wafer W and that of the nozzle and a parameter for the supply system of resist liquid are set when the wafer W, serving as a substrate, is coated with the resist liquid in the so-called one-stroke drawing manner by the coating liquid nozzle. First, an explanation is given of the apparatus configuration for coating the resist liquid with reference to FIGS. 19 and 20.

This coating film forming apparatus comprises a case body 111 having an opening portion 111a (FIG. 20) as an inlet for loading/unloading the wafer with its front surface, and a wafer holding section 112, which is formed in the case body 111, and which has, for example, a vacuum chuck function, which is intermittently movable in a Y direction. The wafer holding section 112 can move up and down through an elevation shaft 114 by an elevation mechanism 113. The elevation mechanism 113 is disposed on a movable table 117, which is movable in the Y direction as being guided by a guide section 116, by a ball screw section 115, which is driven by a motor M1. The motor M1, ball screw section 115 and the guide section 116 constitute the Y-direction driving mechanism. Moreover, the wafer holding section 112 preferably has oscillation generating means (not shown), including, for example, an ultrasonic oscillator, by which oscillation is given to the wafer W after coating the wafer W with the resist liquid so as to further improve uniformity of the coating film.

A top plate 118 of the case body 111 has a slit 119 (partially indicated in FIG. 20) extending in the X direction. In the slit 119, there is provided a coating liquid nozzle 102, which has an upper portion projecting over the top plate 118 and a discharge hole of a lower portion positioned at a lower portion of the top plate 118 to be opposite to the wafer W. The coating liquid nozzle 102 is connected to a liquid supply pipe 121. The liquid supply pipe 121 is connected to a resist liquid supply source 123 via a filter F, a valve 122a, a pump 122, and a valve 122b. A pressure detecting section 124 is provided at a downstream side of filter F. The parts provided to the liquid supply pipe 121 constitute a coating liquid supply control section. As pump 122, for example, a bellow pump, a diaphragm pump and the like are used. Since the pump 122 controls a pressing force to control the discharge pressure, the pump 122 corresponds to a discharge pressure controlling section. The diameter of the discharge hole of the coating liquid nozzle 102 is formed considerably thinly, that is, about 10 µm to 200 µm. Moreover, the coating liquid nozzle 102 is desirably structured to discharge a solvent mist from the surroundings of the discharge hole of resist liquid. This brings about an advantage in which volatilization of the solvent is controlled to maintain viscosity constant.

At the upper portion of the top plate 118, a guide section 131, which extends along the X direction, is provided to hang across support sections 132. The coating liquid nozzle 102 is attached to be movable along the guide section 131 through a moving member 133. The moving member 133 is screwed to a ball screw section 134 extending in the X direction. The rotation of ball screw section 134 by a motor M2 allows the coating liquid nozzle 102 to move in the Y direction through the moving member 133. The motor M2, guide section 131, and ball screw section 134 constitute an X-direction driving mechanism. The moving area of wafer W is enclosed with the case body 111, to form a space where the wafer W is placed as narrow as possible. Then, the space thus formed is filled with a solvent steam when the resist liquid is applied to the wafer W. This makes it possible to suppress volatilization of the solvent from the applied resist liquid. In this case, temperature control means is provided to the top plate 118 to maintain temperature of the space constant as possible from the viewpoint of improvement in uniformity of the inner surface of the film thickness.

When the coating liquid nozzle 102 is moved in the X direction as discharging the resist liquid, the resist liquid is adhered onto the peripheral edge portion of wafer W and also enters the rear surface. In order to prevent such a problem, a mask 135 is provided on the wafer W. The mask 135 covers the entirety of the peripheral edge portion of wafer W. Also, in the mask 135, a portion, which corresponds to the circuit forming area, that is, coating film forming area, is opened. The mask 135 is attached to the movable table 117 that moves the wafer W in the Y direction. For example, the mask 135 is mounted on a mask support section 136, extending to a position, which is a little higher than the surface of the wafer W, from the outside of both sides of wafer W.

An operation for coating the resist liquid will be described before explaining the structure of the part for setting the parameter to carry out the coating of resist liquid.

Now, it is assumed that an end portion of the wafer W at an inner side of the case body 111 (right side in FIG. 20) is a front end portion, seeing from the opening portion 111a of the case body 111. For example, the wafer holding section 112 is positioned such that the front end portion of wafer W is placed below the scanning area of the coating liquid nozzle 102 in the X direction. Then, the wafer holding section 112 is intermittently moved to the inner side of the case body 111 at a predetermined pitch in the Y direction as being guided to the guide section 116 by the ball screw section 115.

While, the coating liquid nozzle 102 reciprocates in the X direction in accordance with timing of intermittent movement of the wafer W. Namely, when the wafer W is in a stationary state, the coating liquid nozzle 102 moves from one end to the other end as discharging the coating liquid on the wafer W. Then, the wafer W moves in the Y direction by a predetermined amount (predetermined pitch). The discharge of coating liquid (resist liquid) is carried out in the following manner. Specifically, the resist liquid is temporarily absorbed from the resist liquid supply source 123 by the pump 122. Then, the bellow is pressed to discharge the resist liquid from the coating liquid nozzle 102 by a predetermined amount. Discharge pressure is controlled by controlling a discharge force of pump 122, for example, force for pressing the bellow based on a pressure detection value of the pressure detecting section 124.

Figure 21:
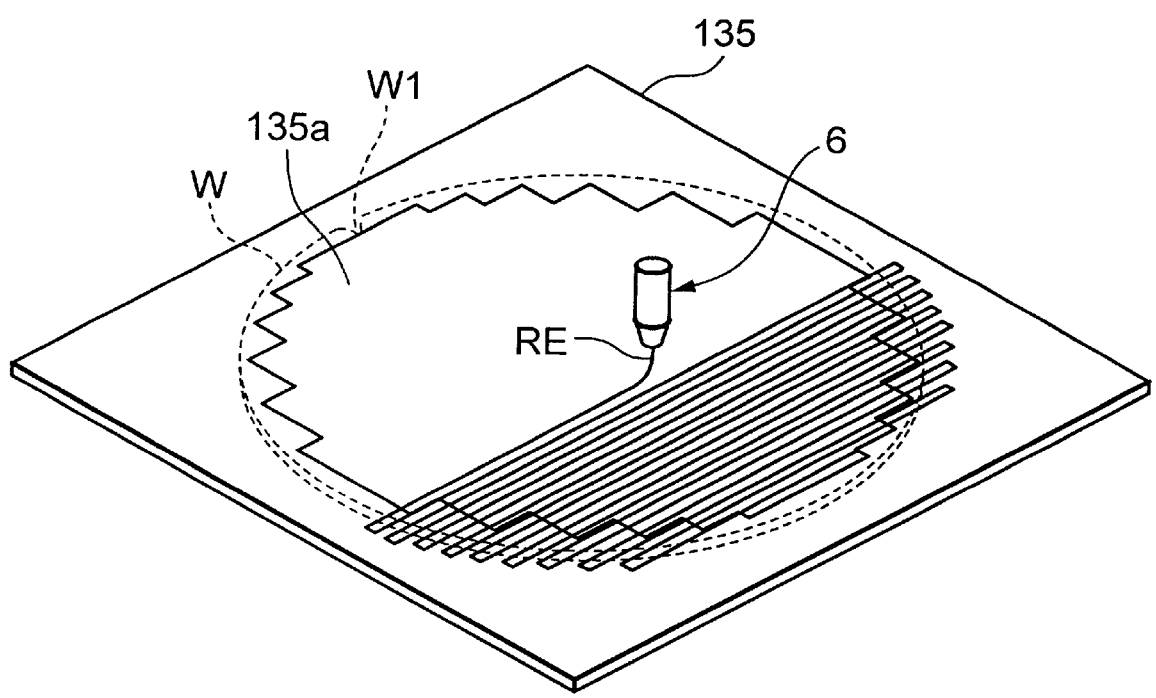
FIG. 21 is a perspective view showing a state in which a resist liquid is applied onto a wafer according to the above embodiment.

The coating liquid nozzle 102 returns at the other end side and moves to one end side as discharging the coating liquid to the wafer W. FIG. 21 is an explanatory view showing this state, and resist liquid RE from the coating liquid nozzle 102 is applied in a one-stroke drawing manner. W1 in FIG. 21 indicates a notch for positioning. The outline of peripheral edge of the circuit forming area of wafer W is a so-called spiral line. Though an opening portion 135a of the mask 135 is shaped to conform to the outline, the edge of the opening portion 135a is formed to be a little extended outwardly than the outline.

Thus, the resist liquid is applied to the entire surface of the circuit forming area of wafer W to form a liquid film. Thereafter, ultrasound is applied to the wafer W by, for example, the ultrasonic oscillator to flatten the liquid film, whereby equalizing the film thickness. After that, the wafer W is dried and the solvent in the liquid film is evaporated so as to obtain a resist film.

Figure 22:
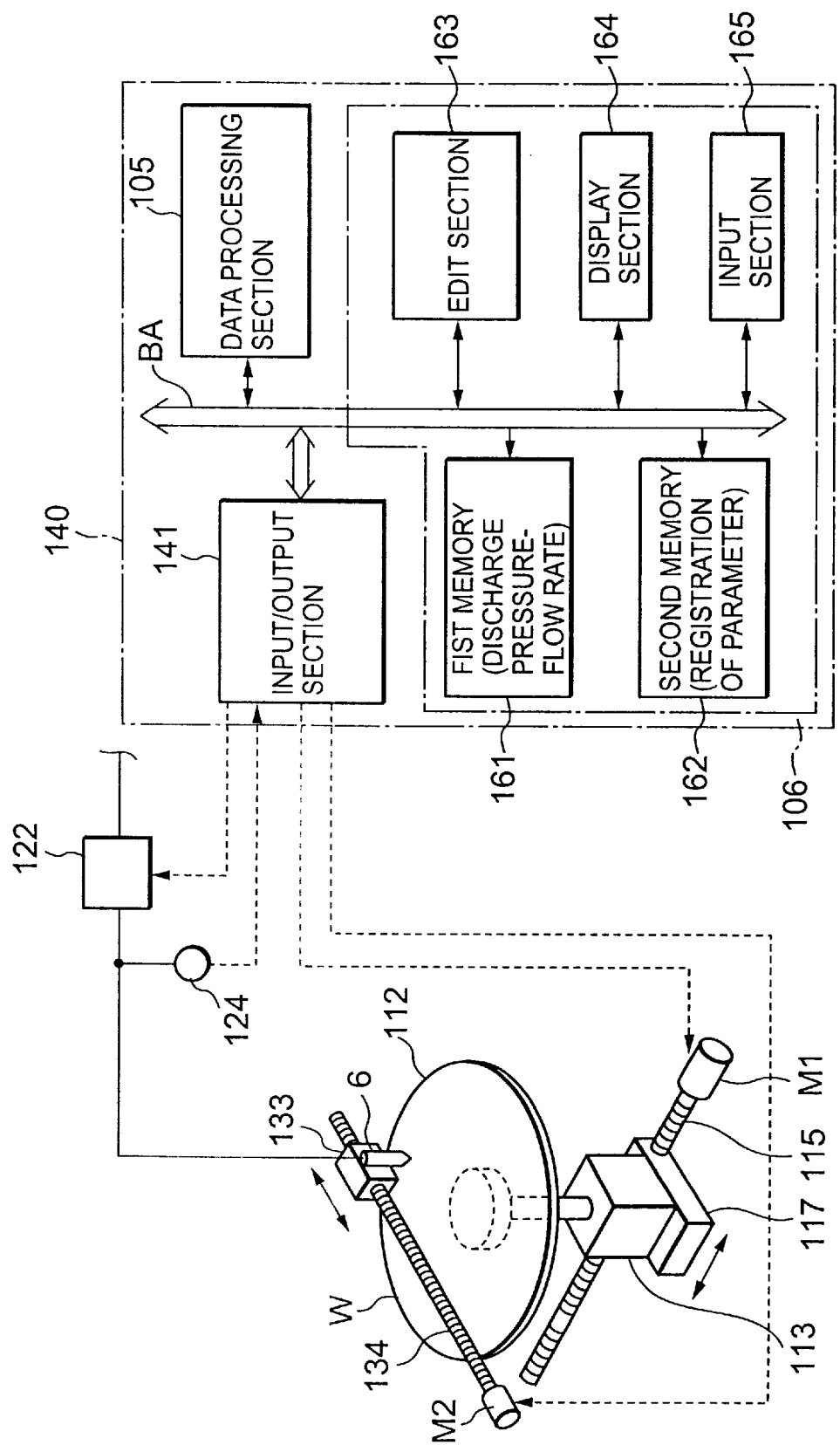
FIG. 22 is a configuration view showing a control section including a parameter setting portion in a coating process according to the above embodiment.

An explanation is next given of the control system including means for setting the parameters with reference to FIG. 22. This coating film forming apparatus comprises motors M1 and M2 and a control section 140 for outputting a control signal including the pump 122 for resist liquid. The control section 140 has a data processing section 105 for generating control signals based on a value of a set parameter and a program stored in a memory (not shown), which is processing means formed of, for example, a CPU. The data processing section 105 generates control signals based on the parameter, which determines a processing condition to be described later, and sends these control signals to the motors M1 and M2 and each actuator (not shown) of the pump 122. This controls a series of operations for coating the wafer W with the resist liquid. BA in the figure denotes a bus.

The control section 140 comprises a parameter setting section 106, for setting the value of the parameter, which is a processing condition on which the wafer W is coated with the resist liquid (coating liquid) by the coating liquid nozzle 102. The parameter setting section 106 includes a first memory 161, as a first storage section, a second memory 162 as a second storage section, an edit section 163, a display section 164, and an input section 165.

Figure 23:
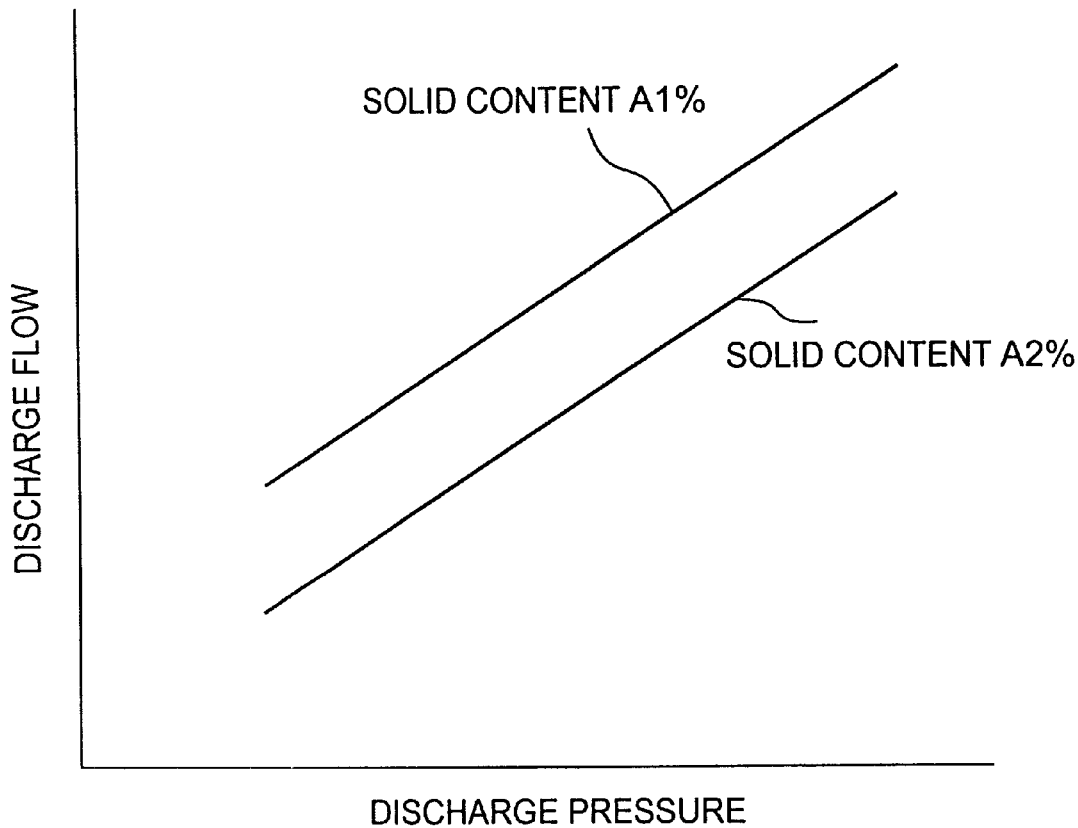
FIG. 23 is a characteristic view showing an image of the relationship between discharge pressure and a discharge flow rate.

The first memory 161 stores data, which defines the relationship between the discharge pressure of the resist liquid and the discharge flow rate. The discharge pressure of the resist liquid and the discharge flow rate are uniquely determined in accordance with the quantity of solid content (solid content quantity) in the coating liquid if the diameter of the discharge hole of the coating liquid nozzle 102 is determined. Namely, the resist liquid is one that is obtained by dissolving the solid content, which is the resist component, in the solvent (thinner). Since viscosity varies depending on the solid content quantity, the relationship between the discharge pressure of the resist liquid and the discharge flow rate (the same as the aforementioned "discharge quantity per unit of time") is changed in accordance with the solid content quantity as shown in FIG. 23. FIG. 24 show data stored in the first memory 161, conceptually, and the descriptions such as A1, P11 are used in place of predetermined numeric values.

The second memory 162 resisters the value of the parameter edited by the edit section 163. The data processing section 105 generates control signals with reference to the value of the parameter registered here, for example.

The edit section 163 comprises a function of setting the residual parameter value based on the parameter values partially designated by the input section 165. In this example, when any two of the scanning speed, which is the moving speed of the coating liquid nozzle 102 in the X direction, the pitch, which is the intermittent moving distance of the substrate in the Y direction, and the discharge pressure of the coating liquid of the coating liquid nozzle are designated, the edit section 163 provides a function of obtaining the residual one based on data stored in the first memory 162. The edit section 163 further comprises a so-called feedback function of correcting the value of the set parameter based on the measured thickness of the resist film obtained based on the value. In FIG. 22, the edit section 163 is illustrated in the form of block. However, for example, in the actual hardware configuration, the edit section 163 comprises a CPU serving as data processing section 105, and a storage section for an edit program.

The display section 164 is formed of, for example, a CRT screen, a liquid crystal screen and the like, and displays the parameter inputted from the input section 165 or the parameter edited by the edit section 163. The input section 165 comprises, for example, a keyboard, a touch-panel, and the like.

Next, though an action of the above embodiment will be described, the explanation hereinafter is given of the setting of the parameter value since the operation in which the coating liquid (resist liquid) is applied to the wafer W by the coating liquid nozzle 102 is already described.

a. Now, it is assumed that the discharge pressure, scanning speed are designated to obtain the pitch in order to set the parameter value for forming the resist film with a thickness of 0.5 $\mu$m on the wafer W having a size of 200 mm (that is, 8-inch size). The hole diameter of the coating liquid nozzle 102 is, for example, 30 $\mu$m and the solid content quantity is 5%. These values and 0.5 $\mu$m, which is a target value of the film thickness, are inputted from the input section 165. Also, the discharge pressure of 2.0 kg/cm2, and the scanning speed of 1 m/s are inputted (designated). FIG. 25(a) is a view schematically showing the display section 164, for example, CRT screen when such an input is executed.

b. The edit section 163 picks up the relational data corresponding to the designated solid content quantity from data (FIG. 23) indicative of the relationship between the discharge pressure and the discharge flow rate stored in the first memory 161 so as to obtain the discharge flow rate based on the picked up data and the designated discharge pressure. In a case where an apparatus, which can change the hole diameter of the coating liquid nozzle 102, is provided, data indicative of the relationship between the discharge pressure and the discharge flow rate is stored for each combination of the hole diameter and the solid content quantity, and corresponding relational data is picked up from the stored data. In this example, the discharge flow rate is 0.55 cc/min.

c. Since the radius of wafer W is 10 cm, the film thickness is 0.5 μm, and the solid content quantity is 5.0%, the quantity of the resist liquid containing thinner in the liquid film of the resist liquid applied to the wafer W can be expressed by equation (1) set forth below;

Area of wafer W×Thickness of resist film×(Ratio of solid content quantity to resist liquid quantity)=$\pi \times 10^2 \times 0.5 \times 10^{-4} \times 100/5.0$= 0.314cc (1)

Since the resist liquid quantity and the discharge flow rate can be obtained, time for which the coating liquid nozzle 102 scans the wafer W can be expressed by equation (2) set forth below:

Resist liquid quantity/Discharge flow rate=$(0.314/0.5) \times 60 = 37.7$(s) (2)

d. Since the scanning speed is set to 1 m/s as mentioned above, the coating liquid nozzle 102 discharges the resist on the wafer W for only 37.7 seconds at this speed. Therefore, a suitable pitch is inputted to track down a value, in which the total scanning time on the wafer W results in 37.7 seconds, whereby obtaining a pitch value. For example, the pitch value becomes 0.36 mm. When the wafer W is divided into n parts on a straight line, the total length of the straight line is obtained geometrically, so that scanning time at this time can be acquired. Then, if the scanning time and 37.7 seconds are compared with each other to track down the umber of equal divisions, the corresponding pitch value can be obtained. Additionally, if the turning point of the coating liquid nozzle 102 is a point just on the borderline of the wafer W, the above calculation may be performed. If the turning point is at a little outside of the wafer W, the calculation may be carried out with consideration given to the corresponding length.

e. Thus, the discharge pressure and the scanning speed are designated, with the result that the pitch is obtained, and these parameter values are displayed as shown in, for example, FIG. 25(b). Then, the data processing section 105 fetches these parameter values, and controls the motor M1 and M2, and the pump 122 in accordance with a predetermined program, so that the resist liquid is applied to the wafer W. The wafer W coated with the resist liquid is dried under, for example, a reduced pressure, thereafter the thickness of the resist film is measured.

f. The edit section 163 corrects the parameter value previously set based on the measured film thickness. This correction is carried out by inputting the measured film thickness to select a parameter to be corrected on the correction screen displayed on the display section 164 as shown in, for example, FIG. 26. An example of FIG. 26 shows a state in which the pitch is selected (enclosed with a double frame). The edit section 163 corrects the pitch in response to the selection, and displays the respective parameter values as corrected parameters including the corrected pitch. For example, it is assumed that the measured film thickness is 90% of the target film thickness. The target resist liquid quantity to be applied to the wafer W is set to 100/90 times, that is, the scanning time is set to 41.9(s), namely, 100/90 times. Similarly, a pitch at which the resist is discharged to the wafer W for only 41.9(s) at the scanning speed of 1 m/s is obtained, and the obtained pitch is set as a corrected pitch. When the scanning speed is selected as a parameter to be corrected, a value of the scanning speed, at which the scanning time of 41.9(s) can be obtained at the pitch of 0.36 mm may be tracked down to obtain in the same manner. When the discharge pressure is selected as a parameter to be corrected, the discharge flow rate is corrected from equation (2), so that the corrected discharge pressure can be obtained based on data stored in the memory 161.

g. The parameter values thus obtained are registered in, for example, the memory 162, and are used as parameter values to provide coating processing to the product wafer W. Then, the parameter values corresponding to the solid content quantity are registered in the memory 162 for each target film thickness, and each of these combinations is managed as one recipe, coating processing can be executed only by selecting these recipes. FIG. 27 shows recipe data stored in the memory 162. Moreover, such a recipe group is provided for each hole diameter of the coating liquid nozzle 102, whereby making it possible to easily deal with a change in the hole diameter of the coating liquid nozzle 102.

In this way, as a method for setting the parameter, the discharge pressure and the pitch may be designated to obtain the scanning speed, or the scanning speed and the pitch may be designated to obtain the discharge pressure. Moreover, the flow control section, for example, a mask controller may be provided to the coating liquid supply control section to set the discharge flow rate as a parameter in place of the discharge pressure. Regarding the intermittent movement between the coating liquid nozzle 102 and the wafer W, the coating liquid nozzle 102 may be moved in the Y direction without moving the wafer W, or both may be moved in the direction opposite to each other at the same time.

According to the aforementioned embodiment, the resist liquid is applied to the wafer W linearly in the one-stroke drawing manner by the coating liquid nozzle. This makes it possible to obtain the coating film with high uniformity of the inner surface of the film thickness without generating air turbulence at the outer peripheral section of the wafer W unlike the spin coating method. Furthermore, since the resist liquid is not splashed to the outside of wafer W, there is an advantage in which the yield of the resist liquid is high.

By designating any two of either the discharge pressure or the discharge flow rate for obtaining the target thickness of the resist film and the scanning speed and the pitch, the residual one is obtained. The combination of these parameters is a mathematical value but it is extremely used as a guideline. Therefore, the so-called condition derivation of film thickness is easily carried out as compared with the case in which the parameter value is obtained in trial and error.

Moreover, the provision of the so-called feedback function in which the set parameter value is corrected based on the measured value of the film thickness makes it much easier to carry out the condition derivation of film thickness. Therefore, the activation of the apparatus can be performed for a short time to bring about a reduction in the series of processes. Additionally, according to the present invention, such a feedback function may be provided to the apparatus, which determines either the discharge pressure or the discharge flow rate, the scanning speed, and the pitch.

An explanation is next given of the case in which the fine adjustment of the respective parameters for further improving uniformity of the film thickness after performing the above-explained recipe setting for the film thickness adjustment (FIG. 27).

Figure 28:
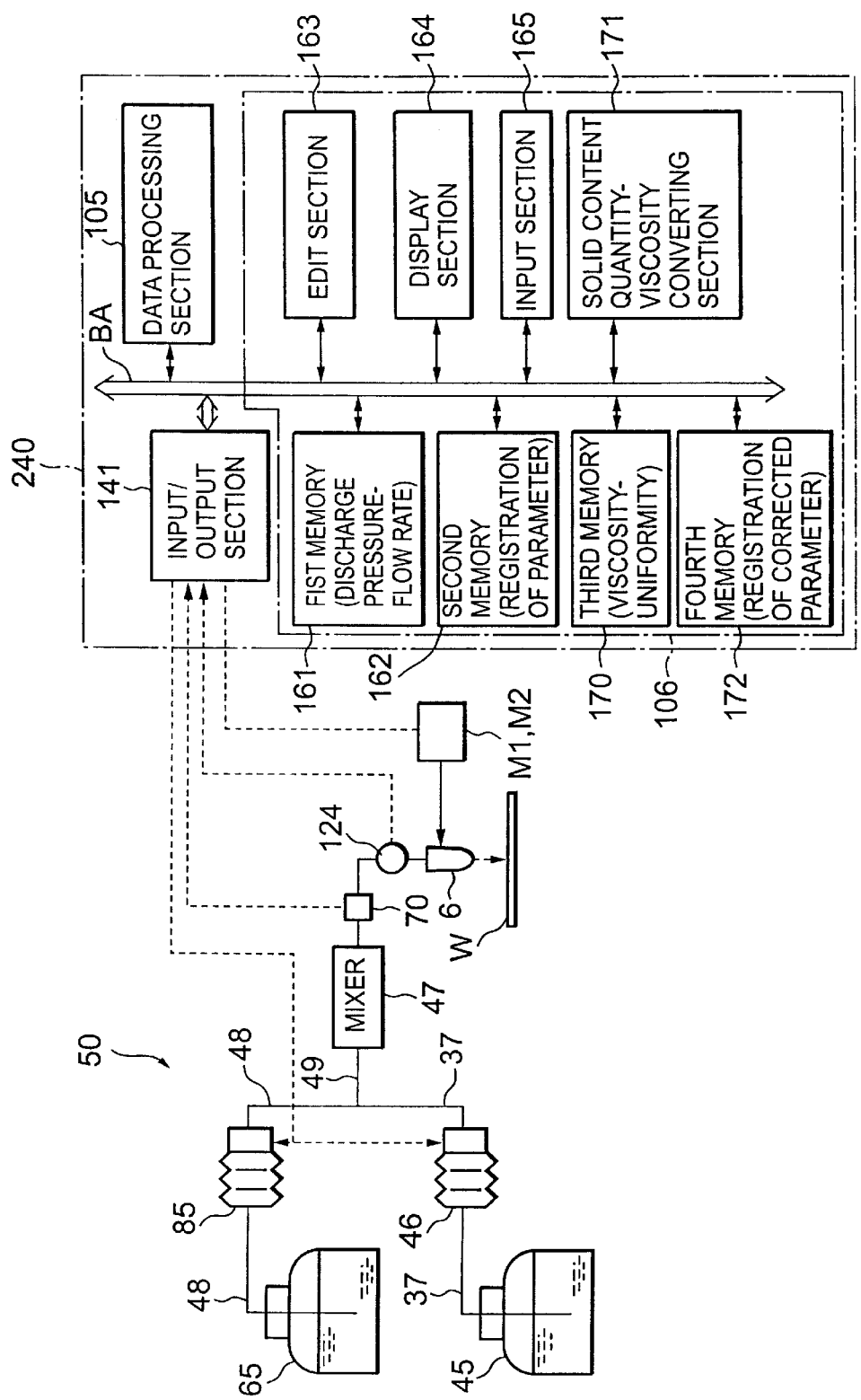
FIG. 28 is a control configuration view further including a parameter setting section for performing fine adjustment of a parameter for reserving uniformity of a film thickness.

As a parameter exerting the largest influence upon uniformity of the film thickness, a ratio of the solid content quantity of resist, that is, resist viscosity can be named. The mixing apparatus 50 shown in FIG. 16 is used as means for varying resist viscosity, to maintain uniformity of the film thickness by changing viscosity. In other words, the recipe shown in FIG. 27 is determined by the film thickness adjustment, for example, resist coating processing is executed in accordance with recipe 1, with the result that the film thickness has a target value of d1 μm as an average value of the entire surface on the wafer W. However, there is a case in which a difference of ±0.1 μm occurs depending on the area of the wafer W. In this case, the fine adjustment of resist viscosity is performed to ensure the film thickness of d1 μm with respect to the entire areas on the wafer W. The control system to ensure uniformity of the film thickness will be explained with reference to FIG. 28. In FIG. 28, the same reference numerals are added to the same structural elements as those of FIGS. 16 and 22, and the explanation is omitted.

In a control section 240 shown in FIG. 28, the parameter setting section 106 of the control section 140 of FIG. 22 further comprises a third memory 170, a solid content quantity-viscosity converting section 171, and a fourth memory 172. The third memory stores the relationship of uniformity between the resist viscosity and the film thickness shown in FIG. 29. The uniformity of the film thickness is defined by a difference between a maximum film thickness and a minimum film thickness relating to the film thickness of the resist applied to the entire surface of the wafer W. The smaller the difference, the higher uniformity is. Such viscosity of the resist C1, C2, C3, . . . that reduces the difference between the maximum film thickness and the minimum film thickness, namely, that improves uniformity most is calculated beforehand for each film thickness, which is obtained as in FIG. 27. Then, the calculation result is stored in the third memory 170. In this case, the calculation result is stored in the third memory 170 as a parameter for each of different film thickness d1, d2, d3, . . .

The solid content quantity-viscosity converting section 171 has a function of converting the dimensions of the solid content quantity and resist liquid viscosity mutually. The fourth memory 172 stores final corrected recipe data to ensure uniformity of the film thickness to be described later.

An explanation is next given of the action for ensuring uniformity of the film thickness. First, the adjustment of film thickness (target film thickness d1) is carried out in accordance with recipe 1 (the solid content quantity A1 (%) corresponds to viscosity B1 (Pa·s)) shown in FIG. 27. As a result, when uniformity of the film thickness is low, viscosity is set to B1±α=C1 (Pa·s) based on data stored in the third memory. In this case, α is smaller than the ranges of solid content quantities A1 and A2. For example, the solid content quantity corresponding to α(Pa·s) is in the range of 0.1 to 0.5 (%), while the solid content quantity shown in FIG. 27 is in the range of 1.0 to 2.0 (%).

Then, since viscosity is changed from B1 to C1, the measured film thickness is slightly shifted from the target film thickness d1. Therefore, in order to correct the target film thickness d1 again, the discharge flow rate and the pitch is finely adjusted. Though the fine adjustments of the discharge flow rate and the pitch are performed by slightly changing the values from the discharge flow rate L1 and the pitch Y1 shown in FIG. 27, the range in the number of digits, which is necessary for performing these fine adjustments, is smaller than the difference between the discharge flow rates L1 and L2 or the difference between the pitches Y1 and Y2.

Figures 29, 30:
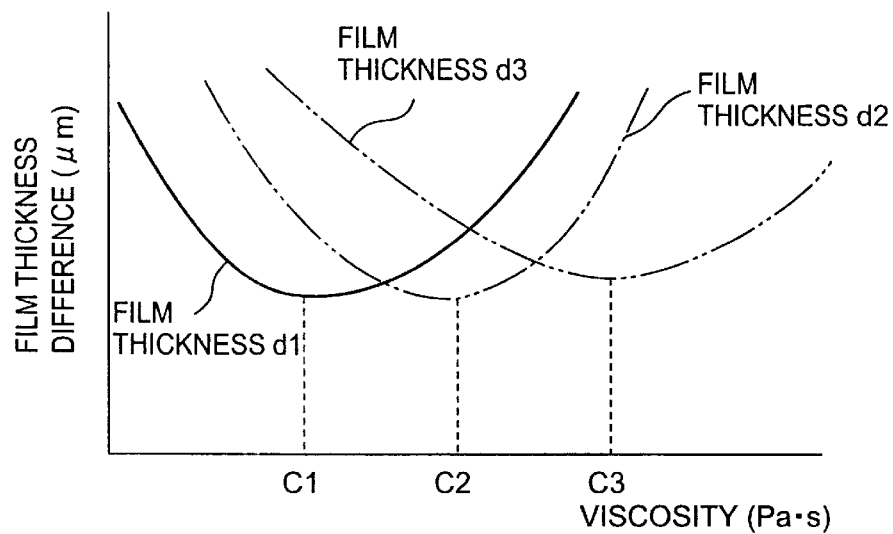
FIG. 29 is a view showing the relationship between viscosity of the resist liquid and a difference in the film thickness for each film thickness.
FIG. 30 is an explanatory view showing corrected data stored in a fourth memory.

Thus, after performing the fine adjustment of resist viscosity appropriate to uniformity of the film thickness, the discharge flow rate and the pitch are finely adjusted, whereby performing the adjustment of film thickness again. FIG. 30 shows corrected recipe data to ensure the aforementioned uniformity, and corrected recipe data is stored in the fourth memory 172. In the figure, the solid content quantity is corrected from A1 to A1', the discharge flow rate is corrected from L1 to L1', and the pitch is corrected from Y1 to Y1' under the film thickness d1. Thus, if these values are managed as recipe data, the coating processing can be carried out as ensuring uniformity of the film thickness only by selecting recipe data.

Figure 31:
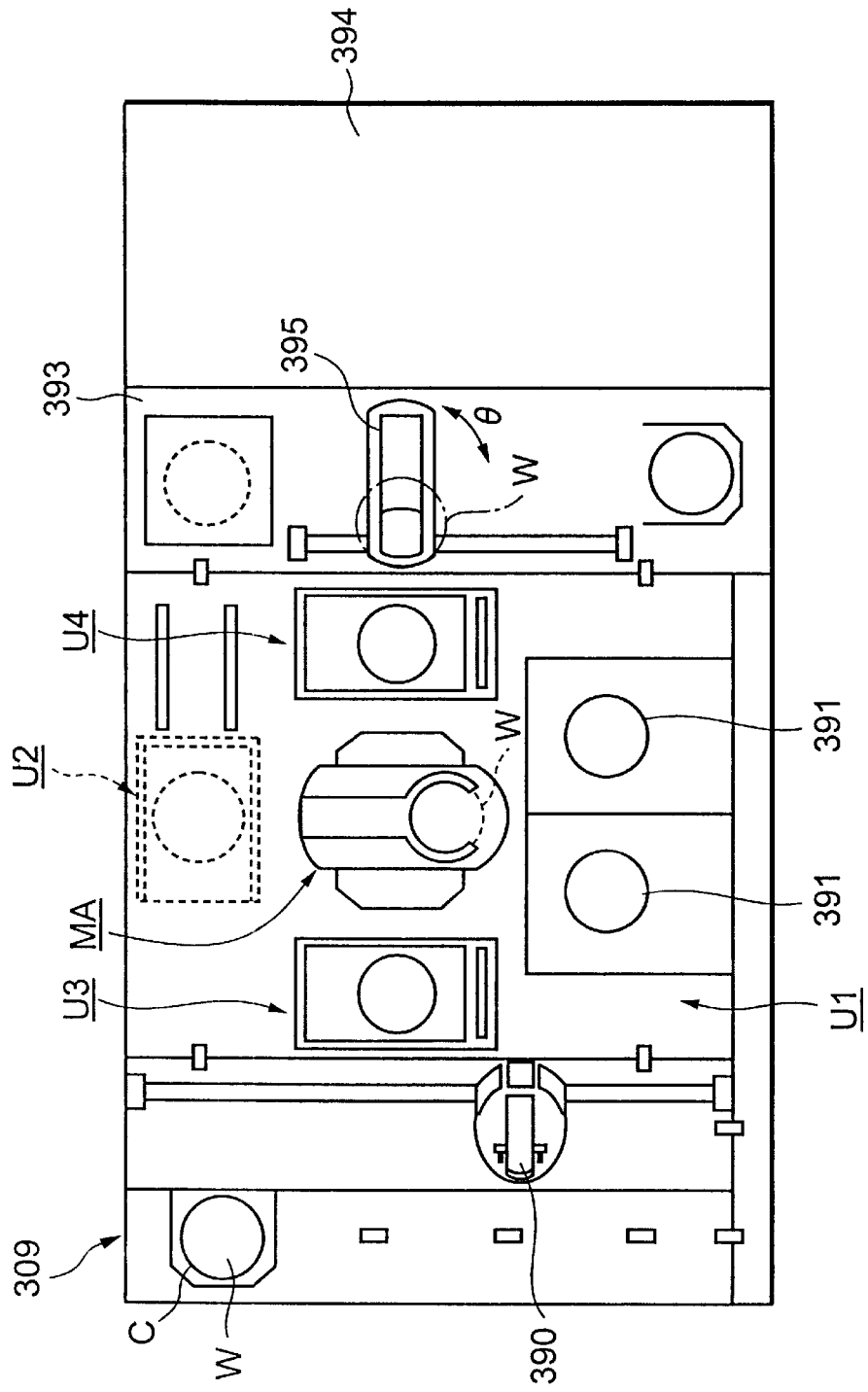
FIG. 31 is a plane view showing a coating/developing apparatus having the coating film forming apparatus of the present invention.
Figure 32:
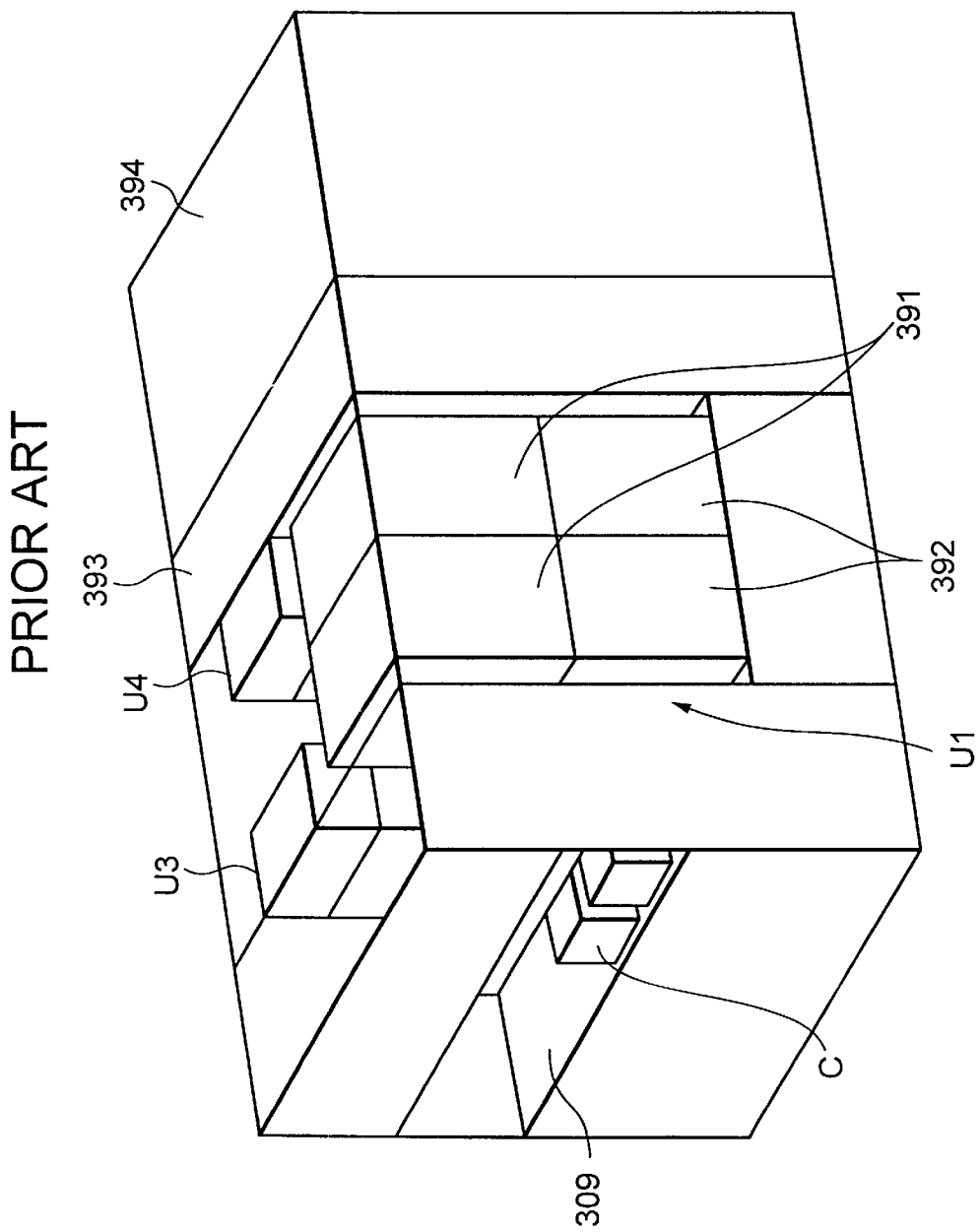
FIG. 32 is a schematic perspective view showing the above coating/developing apparatus.
Figure 33:
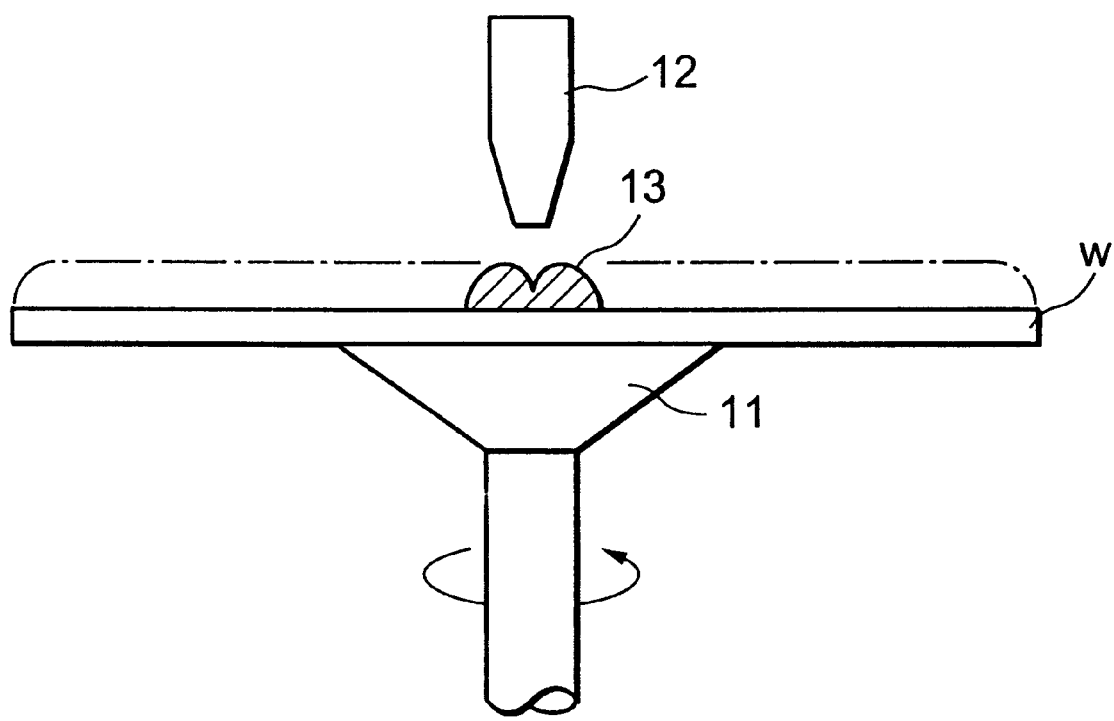
FIG. 33 is a side view showing a conventional resist liquid coating apparatus.
Figure 34:
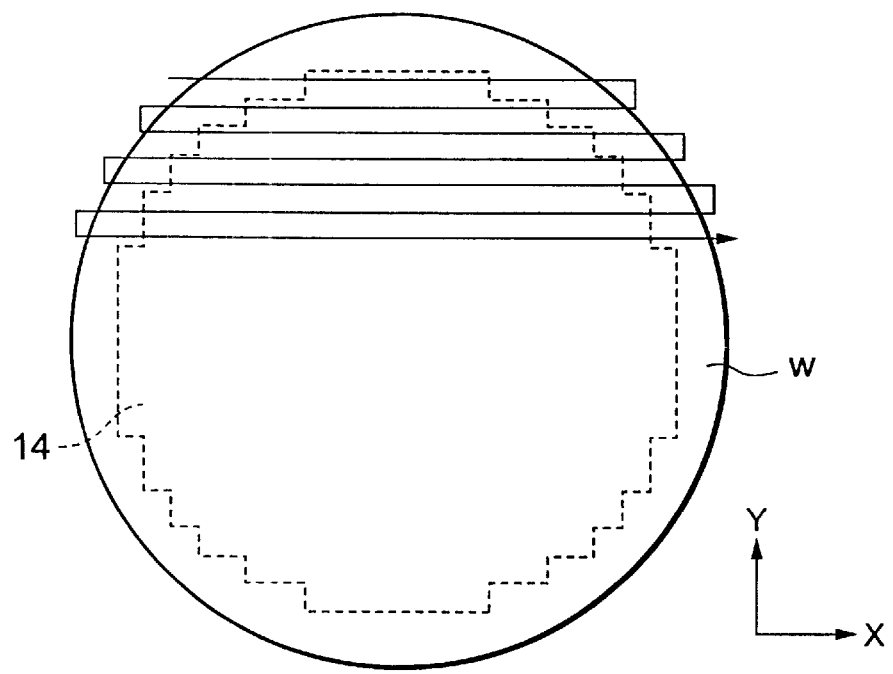
FIG. 34 is a plane view showing a resist liquid coating method of one-stroke drawing type.
Figure 35:
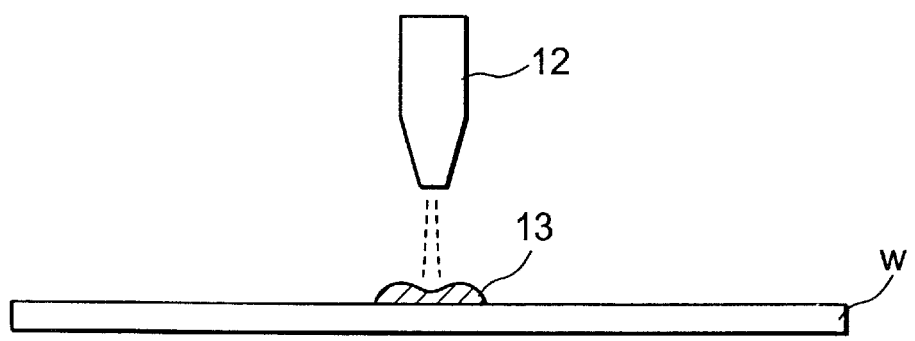
FIG. 35 is a side view showing a state in which the resist liquid is supplied onto the wafer W.
Figure 36:
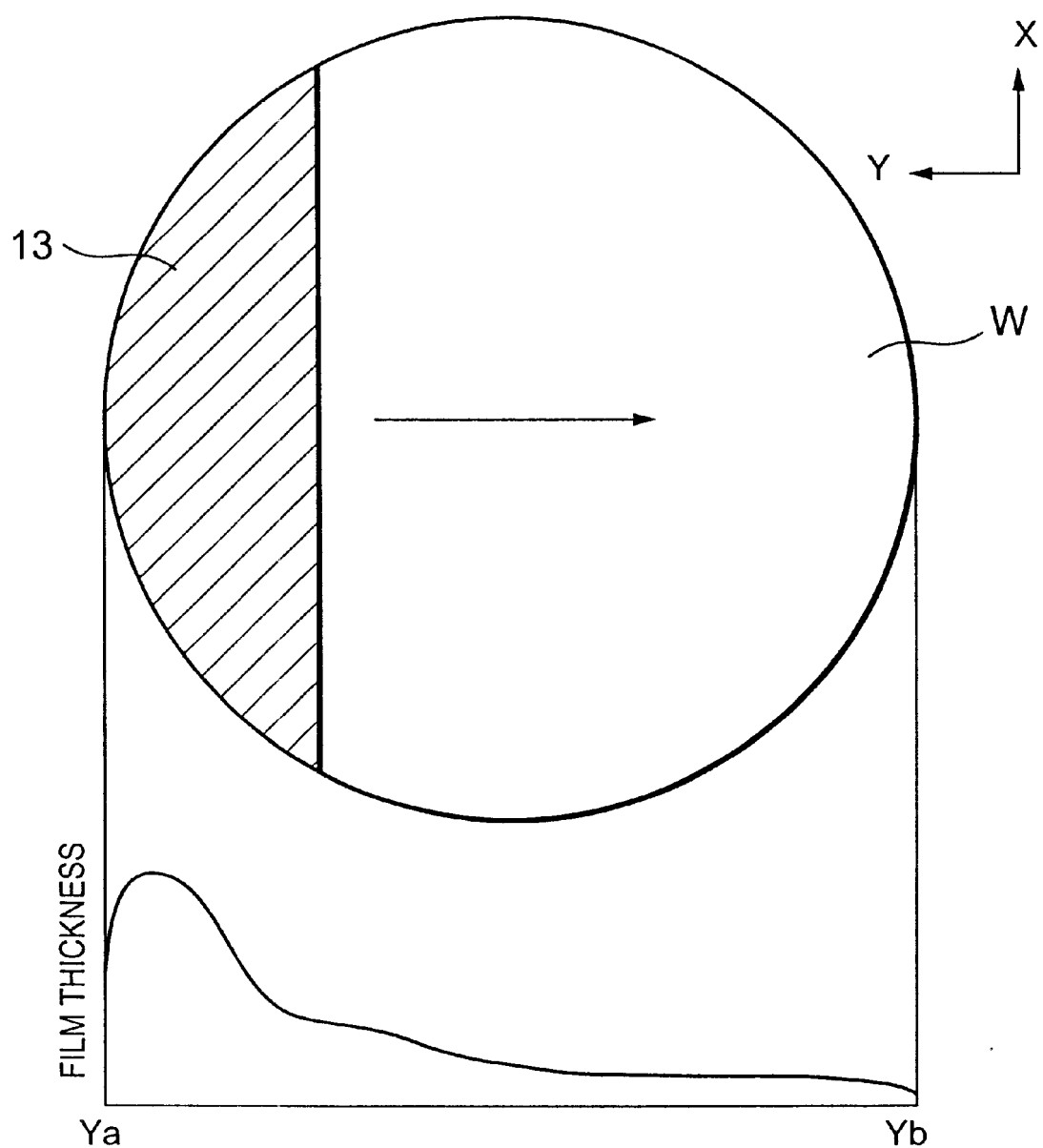
FIG. 36 is a side view showing distribution relating to the thickness of the resist film on the wafer W.

An explanation is next given of the outline of one example of the coating and developing apparatus in which the above-explained developing apparatus is incorporated into the unit with reference to FIG. 31 and 32. In FIGS. 31 and 32, reference numeral 309 is a load/unload stage 309 for loading/unloading a wafer cassette. For example, a cassette C containing 25 wafers is mounted thereon by, for example, an automatic delivery robot. A delivery arm 390 for wafer W is provided at an area facing to the load/unload stage 309 such that rotations in X and Y directions and θ rotation (rotation about a vertical axis) can be freely performed. Moreover, at the inner side of the delivery arm 390, there is provided a unit U1 of a coating/developing system at the right side seeing from the inner side of the load/unload stage 309. Moreover, units U2, U3, and U4 are of a heating/cooling system are provided at the left side, the front side, and the inner side, respectively. Also, there is provided a wafer delivery arm MA for delivering the wafer W between the unit of the coating/developing unit and the unit of the heating/cooling system. The wafer delivery arm MA is structured to be ascendable/descendable, to movable right and left and back and fourth, and to rotatable about a vertical axis. In FIG. 32, the unit U2 and the wafer delivery arm MA are not illustrated for the sake of convenience.

In the unit of the coating/developing system, for example, there is provided a coating unit 392 having two developing units 391 at an upper stage and two coating film forming apparatuses at an lower stage. In the units of the heating/cooling system, a heating unit, a cooling unit, and a hydrophobic processing unit are provided at upper and lower stages.

It is assumed that the portion, which includes the unit of the coating/developing system and the units of the heating/cooling system, is called clean track. An exposure apparatus 394 is connected to the inner side of the clean track through an interface unit 393. The interface unit 393 performs the delivery of wafer W between the clean track and the exposure apparatus 394 by use of a wafer delivery arm 395, which is structured to be ascendable/descendable, to movable right and left and back and fourth, and to rotatable about a vertical axis.

An explanation is given of the flow of the wafer using this apparatus. First, the wafer cassette C, which contains wafers W, is loaded on the load/unload stage 309, from the outer section. The wafer W is picked up from the cassette C by the wafer delivery arm 390, and the picked-up wafer W is delivered to the wafer delivery arm MA through a delivery base, which is one of shelves of the heating/cooling unit U3. The delivered wafer W is subjected to hydrophobic processing in a processing section, which is one of the shelves of the unit U3. Thereafter, resist liquid is applied to the wafer W by the coating unit 392 so as to form a resist film. The wafer W coated with the resist film is heated by the heating unit, and then sent to the exposure apparatus 394 through the interface unit 393, and exposure to light is performed by the exposure apparatus 394 through a mask corresponding to a pattern.

Thereafter, the wafer W is heated by the heating unit, and then cooled by the cooling unit. Sequentially, the resultant wafer W is sent to the developing unit 391 to be subjected to developing processing, whereby forming a resist mask. Thereafter, the wafer W is returned to the cassette C on the load/unload stage 309.

As mentioned above, according to the present invention, the resist liquid may be applied to each of the divided coating regions of the wafer W in the predetermined coating order and/or the predetermined coating direction, whereby forming the liquid film of resist liquid for each of the divided regions of the wafer surface. In this case, the phenomenon, in which the resist liquid is drawn to the coating start position, so as to increase the film thickness of the portion, occurs in only the corresponding region. As a result, uniformity of the inner surface of the film thickness can be improved.

The present invention is not limited to the above-mentioned coating example. The coating is set such that the coating start points of the adjacent divided regions are not next to each other and/or the coating is not continuously performed in order of the coating end position and the coating start position in the case where the coating end position of one region of the adjacent divided regions and the coating start position of the other region of the adjacent divided regions. This makes it possible to freely decide the coating order and/or the coating direction with respect to each divided region. In this case, it is possible to obtain much higher uniformity of the inner surface of the film thickness.

Furthermore, the supply nozzle 6 and the wafer W are relatively moved. For example, the supply nozzle 6 is fixed, and the wafer W may be driven in the X and Y directions. Also, the driving mechanism of the supply nozzle 6 and the wafer holding member 2 is not limited to the above-mentioned mechanism. For example, a belt driving mechanism may be used.

Still, furthermore, in the above-mentioned example, timing at which the resist liquid is supplied to the supply nozzle 6 is controlled by opening/closing the open/close valve 68. However, the present invention is not limited to this structure. For example, the operation of the pump 66 is controlled by the control section C without providing the open/close valve 68, whereby timing at which the resist liquid is supplied to the supply nozzle 6 may be controlled.

The above example explained the resist liquid as treatment solution. The present invention, however, is not limited to this solution. For example, interlayer insulation film material, high conductive material, low dielectric material, high dielectric material, wiring material, organic metal material, and metal paste such as sliver paste can be applied. As a substrate, an LCD substrate, an exposure mask, and like may be used without limiting to the semiconductor wafer. In the present invention, the description "substantially horizontal" denotes that a nearly horizontal state is included, and the description "substantially parallel" denotes that a nearly parallel state is included.

In the above embodiment, the mixing apparatus 50 was used to adjust resist viscosity as shown in FIGS. 32 and 28. However, the present invention is not limited to this. Resists with numerous kinds of viscosity are prepared beforehand, whereby resist coating or viscosity adjustment may be performed.

According to the present invention, the coating area of the substrate is divided, and treatment solution is supplied to the divided regions in the predetermined coating order and/or the predetermined coating direction, so as to form the liquid film of the treatment solution for each divided region. This makes it possible to improve uniformity of the inner surface of the thickness of the liquid film to be formed. This also makes it possible to form the coating film with high yield of coating solution and high uniformity, and to easily perform the parameter setting work for obtaining the necessary film thickness.

The disclosure of Japanese Patent Applications No.11-361266 filed Dec. 20, 1999 and No.11-361267 filed Dec. 20, 1999, including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A coating film forming apparatus comprising:
    a substrate holding section for holding a substrate substantially horizontally;
    a supply nozzle for supplying treatment solution to a surface of the substrate held by the substrate holding section;
    a driving mechanism for relatively driving the substrate holding section and the supply nozzle along a substrate surface direction; and
    a control section for controlling an operation of the driving mechanism,
    wherein the control section controls the operation of the substrate holding section and/or the supply nozzle through the driving mechanism to supply the treatment solution to each of divided coating regions of the substrate in a predetermined coating order and/or a predetermined coating direction, and controls timing at which the treatment solution is supplied to the substrate from the supply nozzle, whereby forming a liquid film of the treatment solution for each divided region of the substrate surface.

2. The coating film forming apparatus according to claim 1, wherein the control section controls the operation of the substrate holding section and/or the supply nozzle through the driving mechanism to supply the treatment solution to each of divided coating regions of the substrate in the predetermined coating order and/or the predetermined coating direction, such that coating start positions of adjacent divided regions are not next to each other.

3. The coating film forming apparatus according to claim 1, wherein when a coating end position of one region of adjacent divided regions and a coating start position of the other region are next to each other, the control section controls the operation of the substrate holding section and/or the supply nozzle through the driving mechanism to supply the treatment solution to each of divided coating regions of the substrate in the predetermined coating order and/or the predetermined coating direction, such that no continuous coating is performed in order of the coating end position and the coating start position.

4. The coating film forming apparatus according to claim 1, wherein the driving mechanism relatively moves the supply nozzle and the substrate holding section in a direction substantially orthogonal to one side of a circuit forming area of the substrate as being intermittently fed at a predetermined pitch in a direction substantially parallel to the one side of the circuit forming area.

5. The coating film forming apparatus according to claim 1, wherein the driving mechanism is structured such that the supply nozzle and the substrate holding section are relatively rotated about a vertical axis and the control section is structured to perform such control through the driving mechanism that the supply nozzle and the substrate holding section are relatively rotated about a vertical axis before moving the supply nozzle and the substrate holding section, which are placed at a coating end position of the divided region, to a coating start position of the divided region to be next coated.

6. The coating film forming apparatus according to claim 1, wherein further comprising means for varying viscosity of the treatment solution to supply the treatment solution having different viscosity for each divided region of the substrate.

7. The coating film forming apparatus according to claim 6, wherein said viscosity varying means dilutes the treatment solution with a solvent to change viscosity.

8. The coating film forming apparatus according to claim 1, wherein the driving mechanism relatively moves the supply nozzle and the substrate holding section as if a spiral were drawn on the surface of the substrate held by the substrate holding section.

9. A coating film forming apparatus comprising:

a substrate holding section for holding a substrate;

a supply nozzle, which is disposed to be opposite to the substrate held by the substrate holding section, for discharging treatment solution to the corresponding substrate;

a treatment solution supply control section for controlling discharge of the treatment solution from the supply nozzle;

an X-direction driving mechanism for moving the supply nozzle in an X direction;

a Y-direction driving mechanism for relatively moving the substrate holding section and the supply nozzle intermittently in a Y direction;

a parameter setting section for partially designating parameters values, which are processing conditions for applying the coating of treatment solution to the substrate by the supply nozzle, to set a residual parameter value; and processing means for generating a control signal for controlling the supply control section, X-direction driving mechanism, and Y-direction driving condition based on th e parameter value set by the parameter setting section, wherein the corresponding supply nozzle is moved in the X direction as discharging the treatment solution from the supply nozzle in a state that the substrate holding section is stopped, and then the substrate holding section and the supply nozzle are relatively moved in the Y direction, and this operation is repeated, whereby applying the treatment solution to an entire surface of a coating film forming area of the substrate.

10. The coating film forming apparatus according to claim 9, wherein the treatment solution is applied to the substrate as discharging the treatment solution in the form of a line with a thin diameter.

11. The coating film forming apparatus according to claim 9, wherein the partial parameter values are any two of a scanning speed, which is a moving speed of the supply nozzle in the X direction, a pitch, which is a relative intermittent moving distance of the substrate in the Y direction with respect to the supply nozzle, and either one of discharge pressure and a discharge flow rate of the treatment solution of the supply nozzle, and the residual parameter value is one of these residual parameter values.

12. The coating film forming apparatus according to claim 11, wherein the parameter setting section comprises a first storage section, which stores the relationship between the discharge pressure and the discharge flow rate of the treatment solution in accordance with a diameter hole of the supply nozzle and a solid content quantity of the treatment solution, and a target film thickness of the coating film and a solid content quantity of the treatment solution are designated, and two of the scanning speed, pitch, and discharge pressure are designated, whereby obtaining one residual value among the scanning speed, pitch, discharge pressure based on these designated values and data stored in the storage section.

13. The coating film forming apparatus according to claim 9, wherein the parameter setting section comprises a display section for displaying the designated parameter values and the obtained parameter value.

14. The coating film forming apparatus according to claim 9, wherein the parameter setting section further comprises a second storage section, which stores the relationship between viscosity of the treatment solution and uniformity of the thickness of the coating film to be applied to the substrate, and viscosity of the treatment solution is finely adjusted, whereby ensuring uniformity of the film thickness.

15. The coating film forming apparatus according to claim 14, wherein the relationship stored in the second storage section is provided for each target film thickness.

16. A coating film forming apparatus comprising:

a substrate holding section for holding a substrate;

a supply nozzle, which is disposed to be opposite to the substrate held by the substrate holding section, for discharging treatment solution to the corresponding substrate;

a treatment solution supply control section for controlling discharge of the treatment solution from the supply nozzle;

an X-direction driving mechanism for moving the supply nozzle in an X direction;

a Y-direction driving mechanism for relatively moving the substrate holding section and the supply nozzle intermittently in a Y direction;

a parameter setting section for setting parameter values, which are processing conditions for applying the coating of treatment solution to the substrate by the supply nozzle, to correct the parameter values based on a measured film thickness, which is actually obtained by the set parameter values, and a target film thickness; and processing means for generating a control signal for controlling the supply control section, X-direction driving mechanism, and Y-direction driving condition based on the parameter value set by the parameter setting section, wherein the corresponding supply nozzle is moved in the X direction as discharging the treatment solution from the supply nozzle in a state that the substrate holding section is stopped, and then the substrate holding section and the supply nozzle are relatively moved in the Y direction, and this operation is repeated, whereby applying the treatment solution to an entire surface of a coating film forming area of the substrate.

17. The coating film forming apparatus according to claim 1, wherein the treatment solution is a resist liquid.

18. A coating film forming apparatus comprising:

a substrate holding section for holding a substrate;

a supply nozzle for supplying treatment solution to a surface of the substrate held by the substrate holding section;

a driving mechanism for relatively driving the substrate holding section and the supply nozzle along a substrate surface direction; and a control section for controlling an operation of the driving mechanism;

wherein the control section controls the operation of the driving mechanism and the supply nozzle such that an area that the processing solution is coated is divided into a plurality of regions and coating start positions of adjacent divided regions are not next to each other, whereby forming a liquid film of the treatment solution for each divided region of the substrate surface.

19. A coating film forming apparatus comprising:

a substrate holding section for holding a substrate;

a supply nozzle for supplying treatment solution to a surface of the substrate held by the substrate holding section;

a driving mechanism for relatively driving the substrate holding section and the supply nozzle along a substrate surface direction; and a control section for controlling an operation of the driving mechanism;

wherein the control section controls the operation of the driving mechanism and the supply nozzle such that no continuous coating is performed in order of a coating end position and a coating start position in a case when an area that the processing solution is coated is divided into a plurality of regions and the coating end position of one region of adjacent divided regions and the coating start position of the other region are next to each other, whereby forming a liquid film of the treatment solution for each divided region of the substrate surface.

* * * * *